(12) United States Patent
Li

(10) Patent No.: US 11,862,247 B2
(45) Date of Patent: *Jan. 2, 2024

(54) SEMICONDUCTOR MEMORY DEVICE

(71) Applicant: Kioxia Corporation, Tokyo (JP)

(72) Inventor: Xu Li, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/091,303

(22) Filed: Dec. 29, 2022

(65) Prior Publication Data

US 2023/0135902 A1   May 4, 2023

Related U.S. Application Data

(63) Continuation of application No. 17/200,701, filed on Mar. 12, 2021, now Pat. No. 11,574,682.

(30) Foreign Application Priority Data

Jul. 20, 2020 (JP) .................................. 2020-123692

(51) Int. Cl.

| G11C 11/34 | (2006.01) |
|---|---|
| G11C 16/04 | (2006.01) |
| G11C 16/26 | (2006.01) |
| H10B 43/27 | (2023.01) |
| G11C 16/08 | (2006.01) |

(52) U.S. Cl.
CPC .......... G11C 16/0483 (2013.01); G11C 16/26 (2013.01); H10B 43/27 (2023.02); *G11C 16/08* (2013.01)

(58) Field of Classification Search
CPC . G11C 16/10; G11C 16/0416; G11C 16/0483; H01L 27/115; H01L 27/11521
USPC ...................................................... 365/185.05
See application file for complete search history.

(56) References Cited

U.S. PATENT DOCUMENTS

| 9,922,717 | B1 | 3/2018 | Maejima |
|---|---|---|---|
| 10,186,323 | B2 | 1/2019 | Maejima |
| 10,211,219 | B2 | 2/2019 | Kito et al. |
| 10,558,397 | B2* | 2/2020 | Komai ............... G11C 16/0483 |
| 11,574,682 | B2* | 2/2023 | Li ........................ G11C 16/32 |
| 2011/0175159 | A1 | 7/2011 | Itagaki et al. |
| 2017/0352430 | A1 | 12/2017 | Chen et al. |
| 2018/0108417 | A1 | 4/2018 | Cai et al. |

FOREIGN PATENT DOCUMENTS

| JP | 2007266143 A | 10/2007 |
|---|---|---|
| JP | 2010080729 A | 4/2010 |
| JP | 2018045749 A | 3/2018 |
| JP | 2018160301 A | 10/2018 |

* cited by examiner

*Primary Examiner* — Son T Dinh

(74) *Attorney, Agent, or Firm* — Holtz, Holtz & Volek PC

(57) ABSTRACT

A semiconductor memory device includes a first memory string including a first select transistor, a first memory cell, a first select element, a second memory cell, and a second select element in series, a second memory string including a second select transistor, a third memory cell, a third select element, a fourth memory cell, and a fourth select element in series, and a control circuit. The control circuit is configured to set the second select transistor to an on state, and to set the third select element and the fourth select element to an off state, when reading data of the first memory cell.

20 Claims, 18 Drawing Sheets

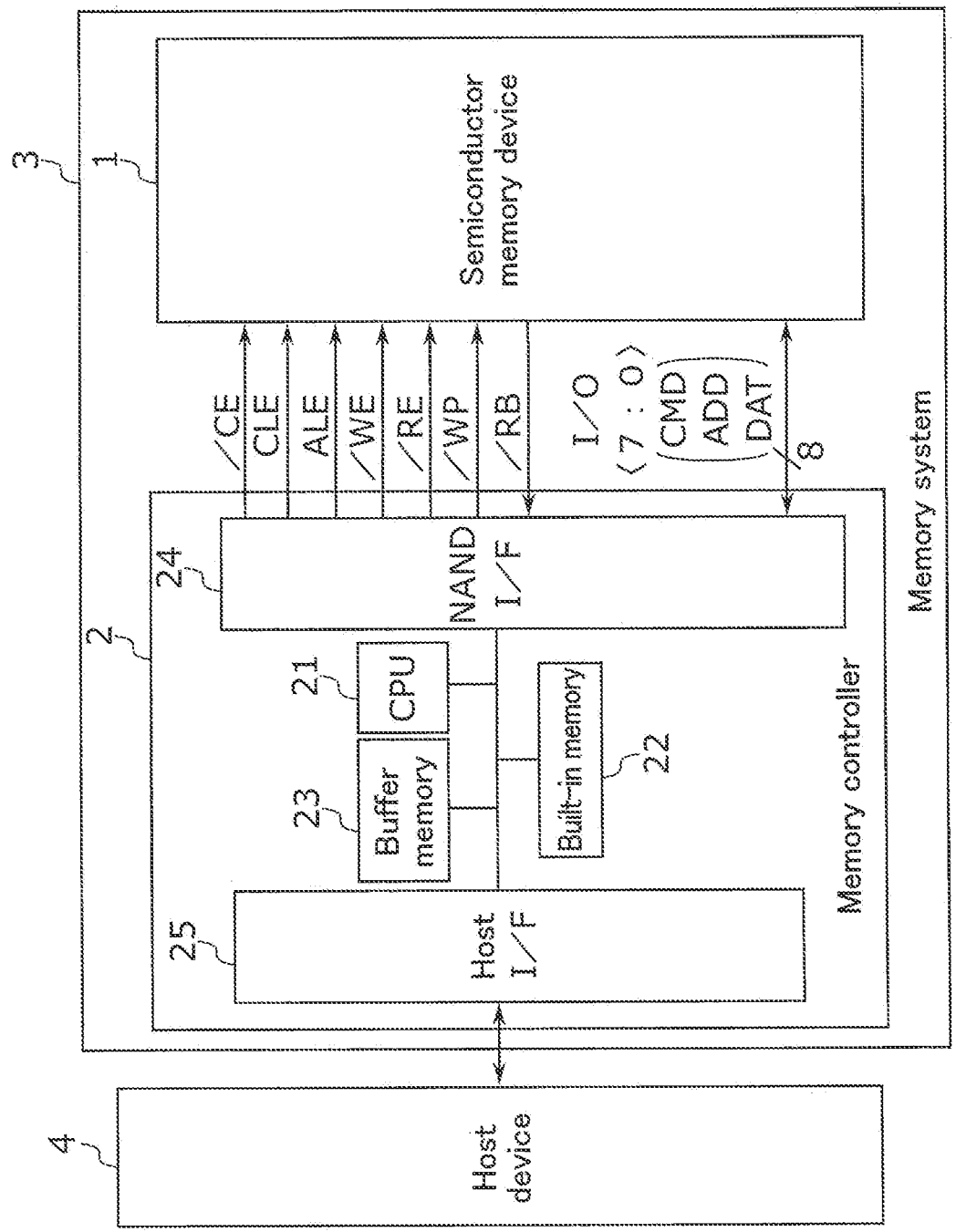
F I G. 1

| | | String unit SU | | | |
|---|---|---|---|---|---|
| | | SU0 | SU1 | SU2 | SU3 |
| Dummy word line DWL | DWLU | DTU_0/"S0" | DTU_1/"S1" | DTU_2/"S2" | DTU_3/"S3" |
| | DWLL2 | DTL2_0/"S3" | DTL2_1/"S2" | DTL2_2/"S1" | DTL2_3/"S0" |
| | DWLL1 | DTL1_0/"S0" | DTL1_1/"S1" | DTL1_2/"S2" | DTL1_3/"S3" |
| | DWLL0 | DTL0_0/"S3" | DTL0_1/"S2" | DTL0_2/"S1" | DTL0_3/"S0" |

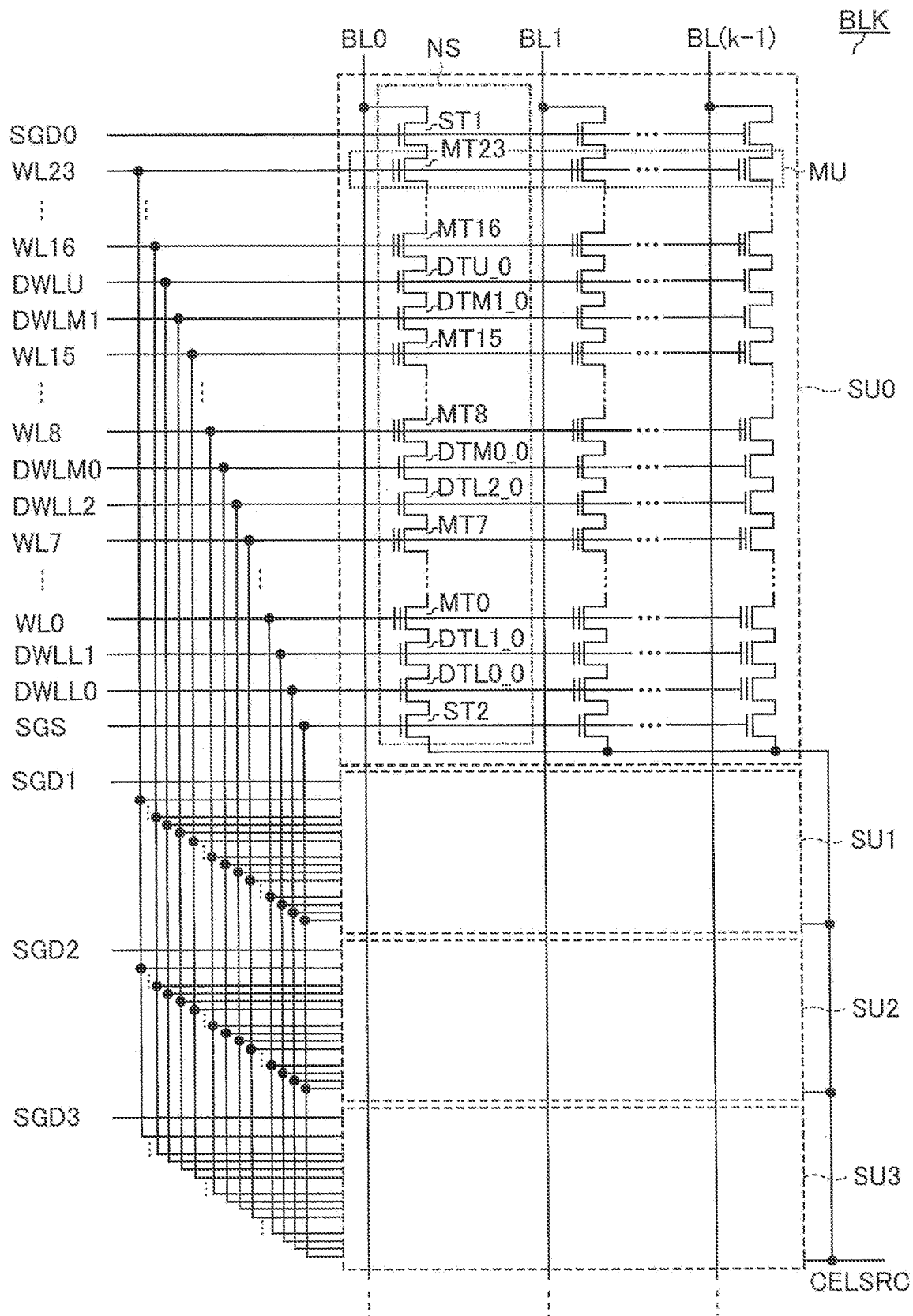
F I G. 11

| Dummy word line DWL | String unit SU | | | |
|---|---|---|---|---|
| | SU0 | SU1 | SU2 | SU3 |
| DWLU | DTU_0/"S0" | DTU_1/"S1" | DTU_2/"S2" | DTU_3/"S3" |
| DWLM1 | DTM1_0/"S3" | DTM1_1/"S2" | DTM1_2/"S1" | DTM1_3/"S0" |
| DWLM0 | DTM0_0/"S0" | DTM0_1/"S1" | DTM0_2/"S2" | DTM0_3/"S3" |
| DWLL2 | DTL2_0/"S3" | DTL2_1/"S2" | DTL2_2/"S1" | DTL2_3/"S0" |
| DWLL1 | DTL1_0/"S0" | DTL1_1/"S1" | DTL1_2/"S2" | DTL1_3/"S3" |
| DWLL0 | DTL0_0/"S3" | DTL0_1/"S2" | DTL0_2/"S1" | DTL0_3/"S0" |

F I G. 13

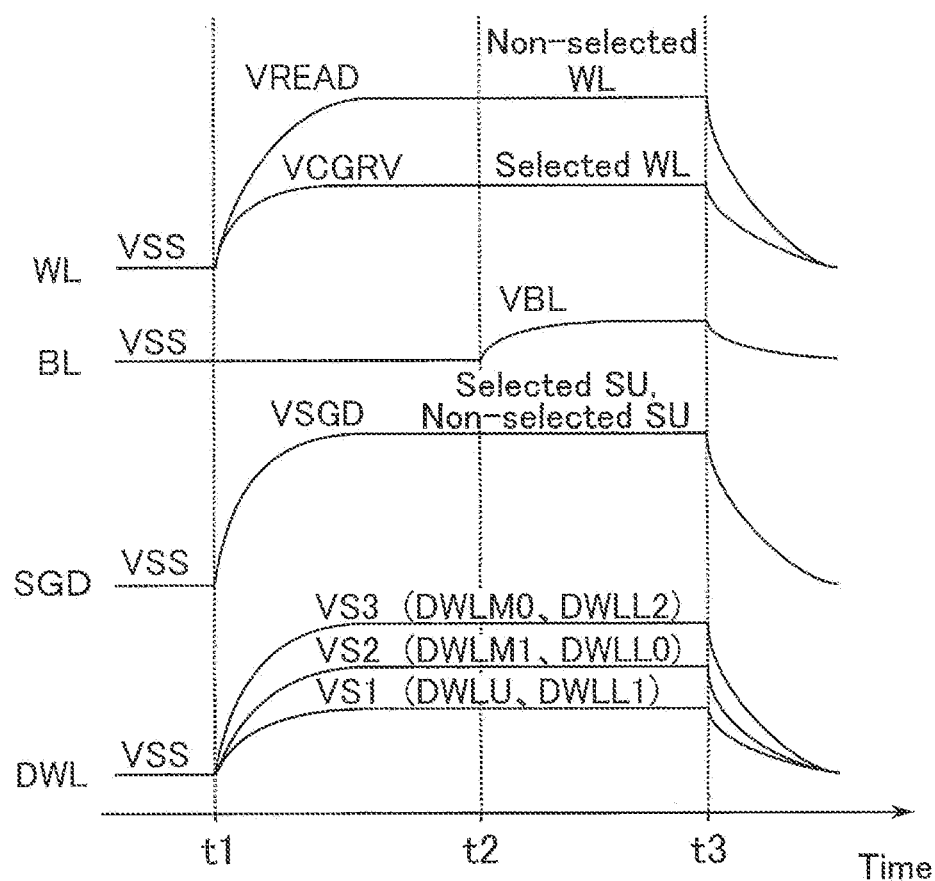
F I G. 18

SEMICONDUCTOR MEMORY DEVICE

CROSS-REFERENCE TO RELATED APPLICATIONS

This application is a Continuation Application of U.S. application Ser. No. 17/200,701, filed Mar. 12, 2021, which is based upon and claims the benefit of priority from Japanese Patent Application No. 2020-123692, filed Jul. 20, 2020, the entire contents of both of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 1 is a block diagram showing an example of a configuration of a memory system including a semiconductor memory device according to a first embodiment;

FIG. 11 is a circuit diagram of a memory cell array included in a semiconductor memory device according to a second embodiment;

FIG. 13 is a diagram showing an example of a state of a threshold voltage set for a dummy cell transistor of the semiconductor memory device according to the second embodiment;

FIG. 18 is a timing chart showing a voltage of each wiring in reading operation (operation example 2-3) using the semiconductor memory device according to the second embodiment.

DETAILED DESCRIPTION

Figure 2:
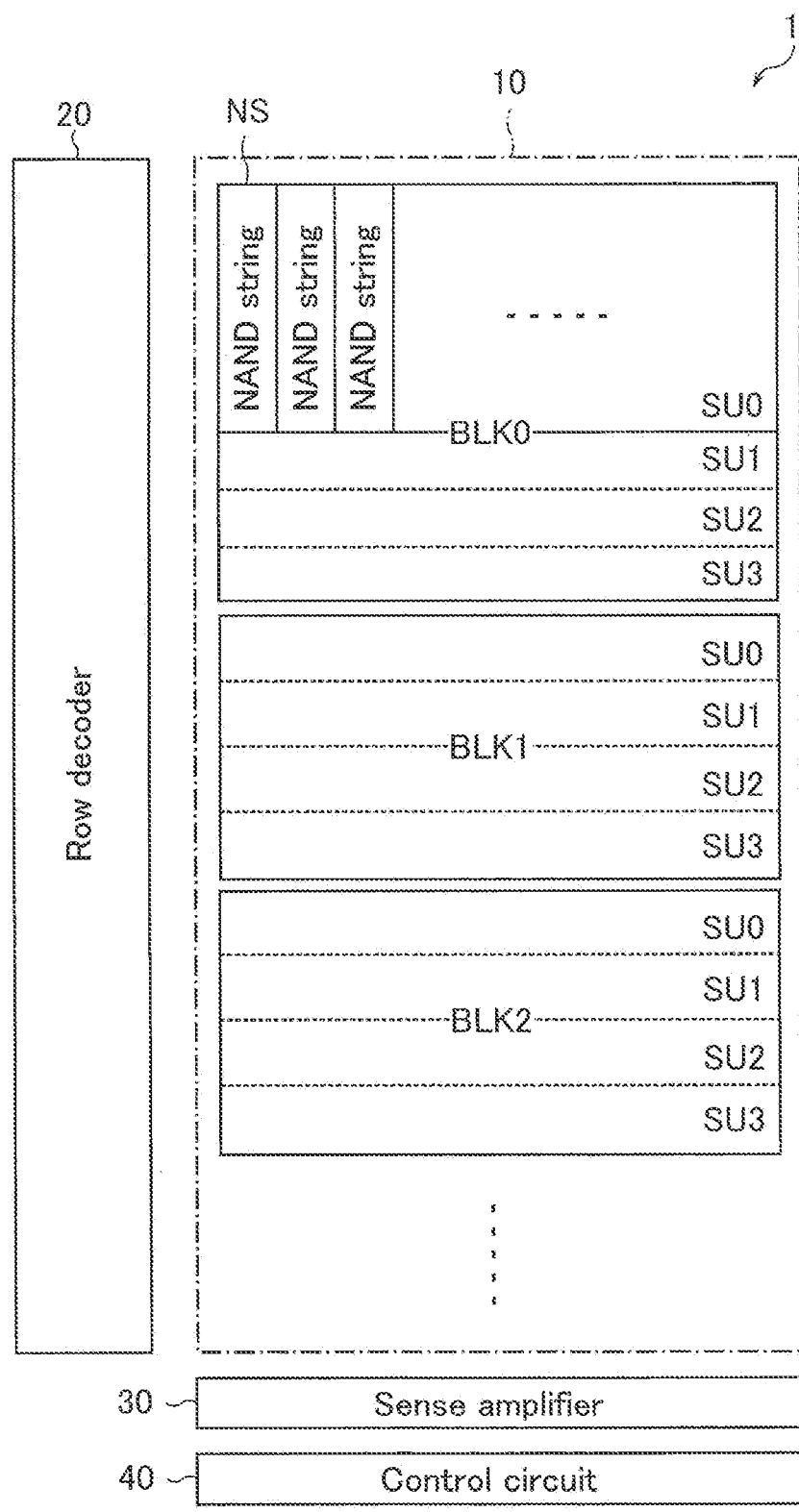
FIG. 2 is a block diagram of the semiconductor memory device according to the first embodiment.

In general, according to one embodiment, a semiconductor memory device includes a first memory string including a first memory cell transistor, a second memory cell transistor, and a first select element that connects the first memory cell transistor and the second memory cell transistor in series, a second memory string including a third memory cell transistor, a fourth memory cell transistor, and a second select element that connects the third memory cell transistor and the fourth memory cell transistor in series, a first wiring connected to a gate of each of the first memory cell transistor and the third memory cell transistor, a second wiring connected to a gate of each of the second memory cell transistor and the fourth memory cell transistor, a third wiring connected to a first end of each of the first memory string and the second memory string, a fourth wiring connected to a second end of each of the first memory string and the second memory string, and a control circuit. The control circuit is configured to set the second select element to an off state while setting the first select element to an on state when reading data of the first memory string.

Hereinafter, embodiments will be described with reference to the drawings. In the description hereinafter, common reference numerals are attached to common parts.

1. First Embodiment

The semiconductor memory device according to the first embodiment will be described. Note that, hereinafter, a NAND flash memory will be described as an example of the semiconductor memory device.

1.1 Configuration

1.1.1 Overall Configuration of Memory System

First, a configuration example of a memory system will be described with reference to FIG. 1. FIG. 1 is a block diagram showing an example of the configuration of a memory system 3 including a NAND flash memory 1 according to the first embodiment.

The memory system 3 communicates with, for example, an external host device 4. The memory system 3 stores data from the host device 4 and reads out the data to the host device 4. The memory system 3 is, for example, a solid state drive (SSD), an SDTM card, or the like.

The memory system 3 includes a memory controller 2 and the NAND flash memory 1.

The memory controller 2 receives an instruction from the host device 4 and controls the NAND flash memory 1 based on the received instruction. Specifically, the memory controller 2 writes in the NAND flash memory 1 the data instructed to write by the host device 4, and reads out from the NAND flash memory 1 the data instructed to read by the host device 4 and transmits the data to the host device 4.

The NAND flash memory 1 includes a plurality of memory cell transistors, each of which stores data in a non-volatile manner. The NAND flash memory 1 is connected to the memory controller 2 by a NAND bus.

The NAND bus transmits and receives, via an individual signal line, each of a chip enable signal/CE, a command latch enable signal CLE, an address latch enable signal ALE, a write enable signal/WE, a read enable signal/RE, a write protect signal/WP, a ready/busy signal/RB, and an input/output signal I/O <7:0> according to a NAND interface. The signal/CE is a signal for enabling the NAND flash memory 1. The signal CLE notifies the NAND flash memory 1 that the signal I/O <7:0> flowing through the NAND flash memory 1 is a command while the signal CLE is at the "H (High)" level. The signal ALE notifies the NAND flash memory 1 that the signal I/O <7:0> flowing through the NAND flash memory 1 is an address while the signal ALE is at the "H" level. The signal/WE instructs the NAND flash memory 1 to capture the signal I/O <7:0> flowing through the NAND flash memory 1 while the signal/WE is at the "L (Low)" level. The signal/RE instructs the NAND flash memory 1 to output the signal I/O <7:0>. The signal/WP instructs the NAND flash memory 1 to prohibit data writing and erasing. The signal/RB indicates whether the NAND flash memory 1 is in a ready state (a state of accepting an external instruction) or a busy state (a state of not accepting an external instruction). The signal I/O <7:0> is, for example, an 8-bit signal.

The signal I/O <7:0> is sent and received between the NAND flash memory 1 and the memory controller 2, and includes a command CMD, an address ADD, and data DAT. The data DAT includes write data and read data.

Examples of the host device 4 that uses the memory system 3 described above include a digital camera, a personal computer, and the like.

1.1.2 Configuration of Memory Controller

The configuration of the memory controller 2 will be described still with reference to FIG. 1.

As shown in FIG. 1, the memory controller 2 includes a central processing unit (CPU) 21, a built-in memory 22, a buffer memory 23, a NAND interface circuit (NAND I/F) 24, and a host interface circuit (host I/F) 25. The memory controller 2 is configured as, for example, a system-on-a-chip (SoC).

The CPU 21 controls the operation of the entire memory controller 2. For example, the CPU 21 issues, to the NAND flash memory 1, a read instruction based on the NAND interface in response to a data read instruction received from the host device 4. This operation is similarly performed in the case of writing and erasing. Further, the CPU 21 has a function of executing various operations on the data read from the NAND flash memory 1.

The built-in memory 22 is, for example, a semiconductor memory such as a dynamic random access memory (DRAM), and is used as a work area of the CPU 21. The built-in memory 22 stores firmware for managing the NAND flash memory 1, various management tables, and the like.

The buffer memory 23 temporarily stores the read data received from the NAND flash memory 1 by the memory controller 2, the write data received from the host device 4, and the like.

The NAND interface circuit 24 is connected to the NAND flash memory 1 via the NAND bus and controls communication with the NAND flash memory 1. The NAND interface circuit 24 transmits the command CMD, the address ADD, and the write data to the NAND flash memory 1 according to an instruction of the CPU 21. Further, the NAND interface circuit 24 receives the read data from the NAND flash memory 1.

The host interface circuit 25 is connected to the host device 4 via a host bus and controls communication between the memory controller 2 and the host device 4. The host interface circuit 25 transfers, for example, an instruction and data received from the host device 4 to the CPU 21 and buffer memory 23, respectively.

1.1.3 Configuration of NAND Flash Memory

Next, a configuration example of the NAND flash memory 1 according to the first embodiment will be described with reference to FIG. 2. FIG. 2 is a block diagram showing an example of the configuration of the NAND flash memory 1 according to the first embodiment.

The NAND flash memory 1 includes a memory cell array 10, a row decoder 20, a sense amplifier 30, and a control circuit 40.

The memory cell array 10 includes a plurality of blocks BLK (BLK0, BLK1, BLK2, . . . ) including a non-volatile memory cell transistor associated with a row and a column. Each of the blocks BLK includes, for example, four string units SU (SU0 to SU3). Then, each of the string units SU includes a plurality of NAND strings NS. The number of blocks in the memory cell array 10 and the number of string units in the block are optional. Details of the memory cell array 10 will be described later.

The row decoder 20 decodes a row address, selects one of the blocks BLK based on the decoding result, and further selects one of the string units SU. Then, a required voltage is output to the block BLK. The row address is provided by, for example, the memory controller 2 that controls the NAND flash memory 1.

During data reading operation, the sense amplifier 30 senses a threshold voltage of the memory cell transistor for which reading operation is to be performed in the memory cell array 10. Then, a sense result is output to the memory controller 2 as read data. At the time of data writing operation, write data received from the external memory controller 2 is transferred to the memory cell array 10.

The control circuit 40 controls the operation of the entire NAND flash memory 1.

1.1.4 Configuration of Memory Cell Array

Figure 3:
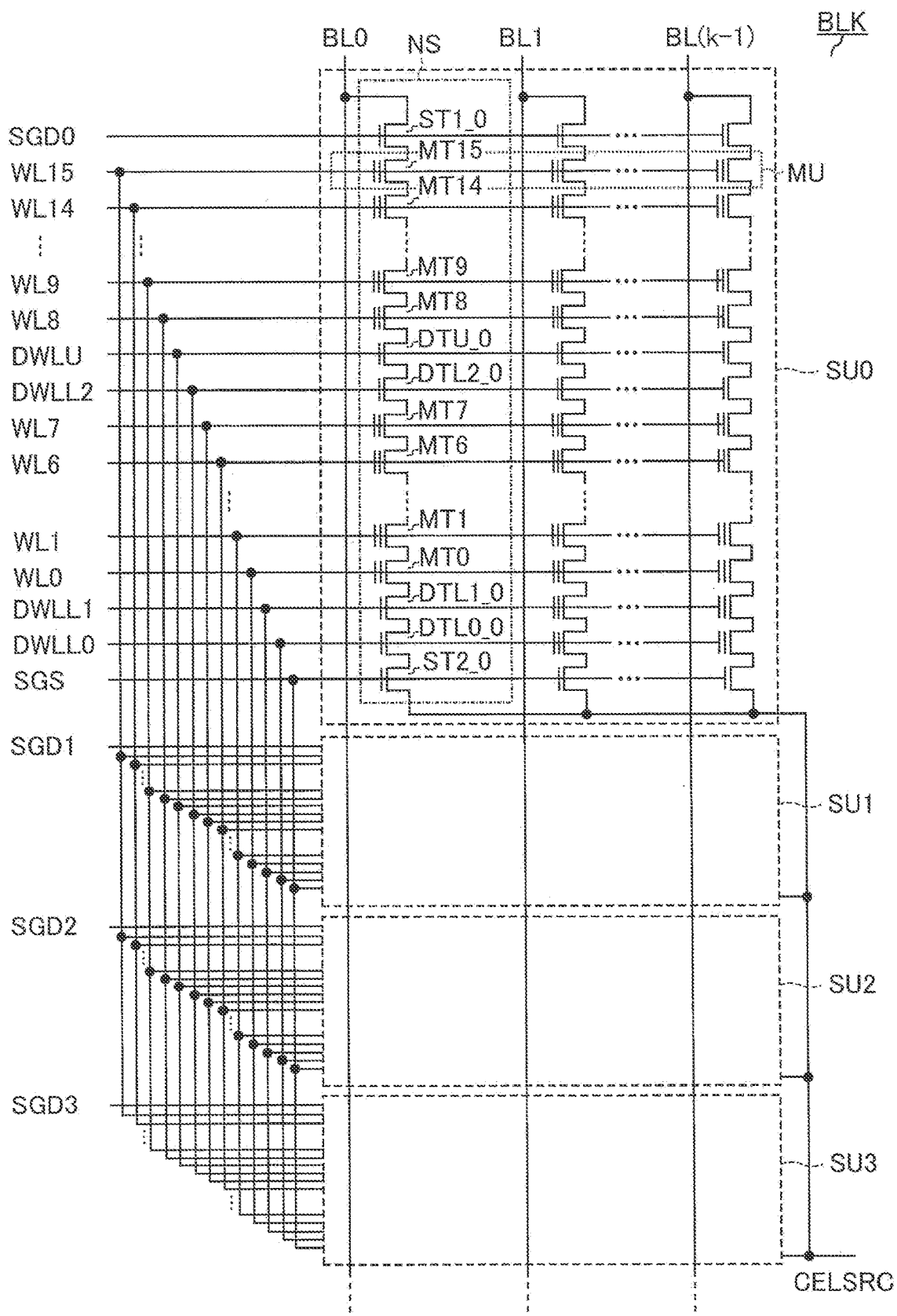
FIG. 3 is a circuit diagram of a memory cell array included in the semiconductor memory device according to the first embodiment.

Next, the configuration of the memory cell array 10 will be described with reference to FIG. 3. FIG. 3 is a circuit diagram of the memory cell array 10 included in the NAND flash memory 1 according to the first embodiment. The example of FIG. 3 shows one of the blocks BLK in the memory cell array 10, but the configuration of the other blocks BLK is also the same. As described above, the block BLK includes, for example, four of the string units SU, and each of the string units SU includes a plurality of the NAND strings NS.

Each of the NAND strings NS includes 16 memory cell transistors MT (MT0 to MT15), two select transistors ST1 and ST2, and four dummy cell transistors DT (DTU, DTL0, DTL1, and DTL2). Note that, in the description hereinafter, two of the select transistors ST1 and ST2 in the string unit SUi (i is an integer of 0 or more and 3 or less) are referred to as select transistors ST1_i and ST2_i, respectively, and four of the dummy cell transistors DTU, DTL0, DTL1, and DTL2 in the string unit SUi are referred to as dummy cell transistors DTU_i, DTL0_i, DTL1_i, and DTL2_i, respectively.

The memory cell transistor MT includes a control gate and a charge storage layer, and stores data in a non-volatile manner.

The source of the dummy cell transistor DTL0 is connected to the drain of the select transistor ST2. The drain of the dummy cell transistor DTL0 is connected to the source of the dummy cell transistor DTL1.

The memory cell transistors MT0 to MT7 are connected in series between the dummy cell transistor DTL1 and the dummy cell transistor DTL2 in this order. The source of the memory cell transistor MT0 on one end side of this series connection is connected to the drain of the dummy cell transistor DTL1, and the drain of the memory cell transistor MT7 on the other end side is connected to the source of the dummy cell transistor DTL2.

The drain of the dummy cell transistor DTL2 is connected to the source of the dummy cell transistor DTU.

The memory cell transistors MT8 to MT15 are connected in series between the dummy cell transistor DTU and the select transistor ST1 in this order. The source of the memory cell transistor MT8 on one end side of this series connection is connected to the drain of the dummy cell transistor DTU, and the drain of the memory cell transistor MT15 on the other end side is connected to the source of the select transistor ST1.

Note that, in the example shown in the first embodiment, the case where each of the NAND strings NS includes 16 memory cell transistors MT is shown. However, the number of the NAND strings NS may be 8, 24, 32, 48, 64, 96, 128, or the like, and is not limited.

The gate of the select transistor ST1 in each of the string units SU0 to SU3 is connected to select gate lines SGD0 to SGD3, respectively. In contrast, the gate of the select transistor ST2 in each of the string units SU0 to SU3 is common-connected to, for example, a select gate line SGS. However, the gate of the select transistor ST2 may be connected to a different select gate line for each of the string units SU.

Further, the control gates of the memory cell transistors MT0 to MT15 in the same block BLK are common-connected to word lines WL0 to WL15, respectively.

Further, the control gates of the dummy cell transistors DTU, DTL0, DTL1, and DTL2 in the same block BLK are common-connected to dummy word lines DWLU, DWLL0, DWLL1, and DWLL2, respectively. However, the gates of the dummy cell transistors DTU, and DTL0 to DTL2 may be connected to different dummy word lines for each of the string units SU. Note that, in description hereinafter, the dummy word lines DWLU and DWLL0 to DWLL2 are also collectively referred to as a dummy word line DWL.

Further, the drain of the select transistor ST1 of each of the NAND strings NS in the string unit SU is connected to a different bit line BL (BL0 to BL(k−1), where k is a natural number of two or more). Further, the bit line BL common-connects one of the NAND string NS in each of the string units SU between a plurality of the blocks BLK. Furthermore, the sources of a plurality of the select transistors ST2 are common-connected to a source line CELSRC.

That is, the string unit SU is a set of the NAND strings NS connected to different ones of the bit lines BL and connected to the same select gate line SGD. Further, the block BLK is a set of a plurality of the string units SU having a common word line WL. Then, the memory cell array 10 is a set of a plurality of the blocks BLK having a common bit line BL.

Data erasure is performed collectively for the memory cell transistors MT in the same block BLK, for example. In contrast, data reading and writing may be collectively performed for a plurality of the memory cell transistors MT common-connected to one of the word lines WL in one of the string units SU of one of the blocks BLK. Such a set of the memory cell transistors MT sharing the word line WL in one of the string units SU is referred to as, for example, a memory cell unit MU. That is, the memory cell unit MU is a set of the memory cell transistors MT for which writing or reading operation may be executed collectively.

The unit of a data string of one-bit data stored in each of a plurality of the memory cell transistors MT in the memory cell unit MU is defined as a "page". One memory cell transistor MT can store, for example, two-bit data. This two-bit data is called a lower bit and an upper bit from the lower bit. In this case, data of two pages is stored in the memory cell unit MU, and a set of lower bits stored by each of the memory cell transistors MT in the memory cell unit MU is called a lower page, and a set of upper bits is called an upper page.

1.1.5 Structure of Memory Cell Array

Figure 4:
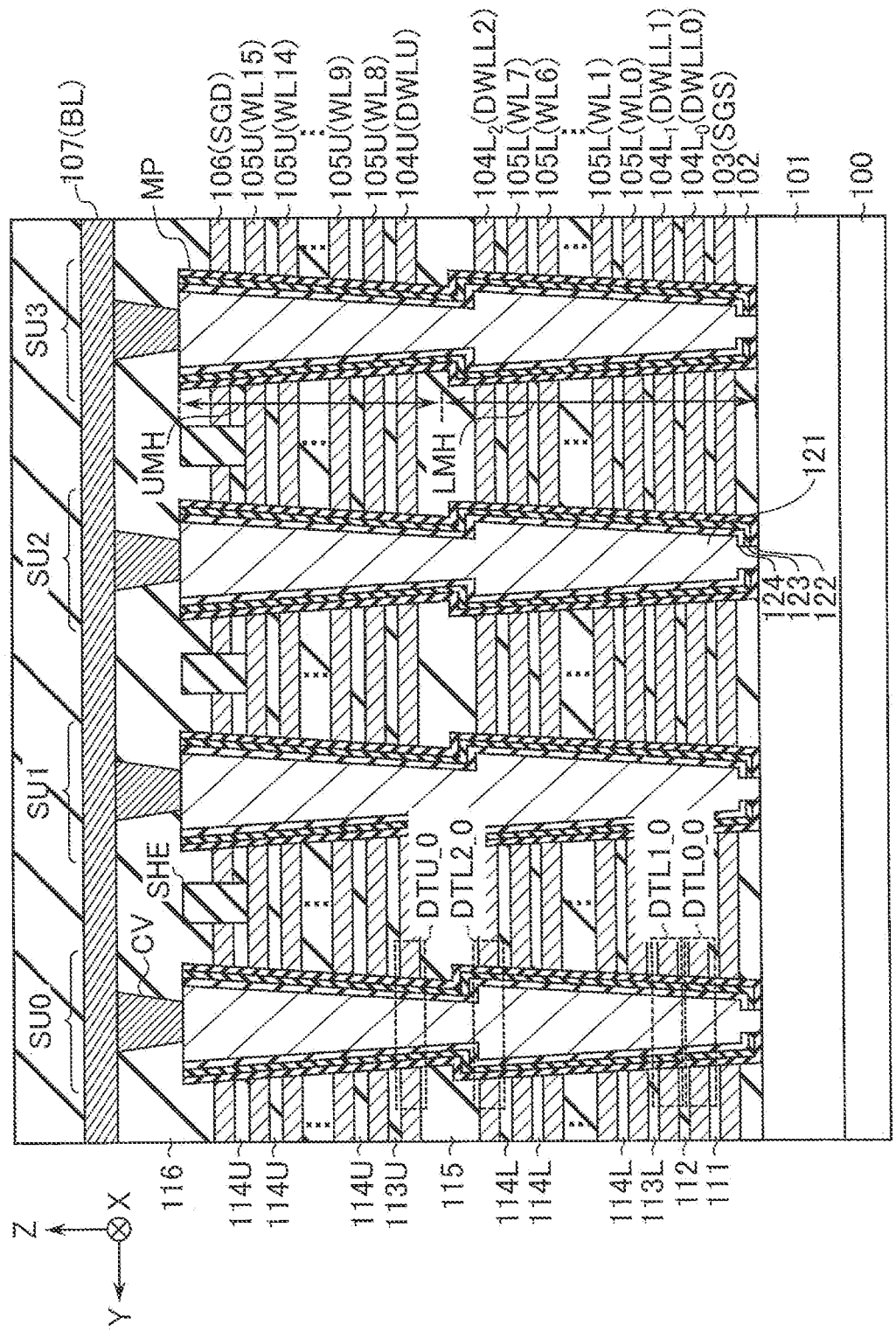
FIG. 4 is a cross-sectional view showing an example of a structure of the memory cell array in the semiconductor memory device according to the first embodiment.

A structure of the memory cell array 10 of the NAND flash memory 1 according to the first embodiment will be described with reference to FIG. 4. FIG. 4 is a cross-sectional view of the structure of the memory cell array 10.

Note that, in the drawings referred to below, the X axis corresponds to an extending direction of the word line WL, the Y axis corresponds to an extending direction of the bit line BL, and the Z axis corresponds to a vertical direction with respect to a surface of a semiconductor substrate on which the NAND flash memory 1 is formed.

The NAND flash memory 1 includes a semiconductor substrate 100 and conductive layers 103 to 106. The conductive layer 104 includes one of each of conductive layers 104L0, 104L1, 104L2, and 104U. The conductive layer 105 includes eight of each of conductive layers 105L and 105U.

The semiconductor substrate 100 includes a P-type well region 101 provided near the surface of the semiconductor substrate 100.

An insulating layer 102 is provided on the P-type well region 101. The conductive layer 103 is stacked on the insulating layer 102. The conductive layer 103 is formed in a plate shape extending along an XY plane, for example. The conductive layer 103 is used as the select gate line SGS. The conductive layer 103 contains, for example, tungsten.

An insulating layer 111 is provided on the conductive layer 103. The conductive layer 104L0, an insulating layer 112, and the conductive layer 104L1 are stacked in this order on the insulating layer 111. The conductive layers 104L0 and 104L1 are formed in a plate shape extending along the XY plane, for example. The conductive layers 104L0 and 104L1 are used as the dummy word lines DWLL0 and DWLL1, respectively. The conductive layers 104L0 and 104L1 contain, for example, tungsten.

An insulating layer 113L is provided on the conductive layer 104L1. On the insulating layer 113L, eight conductive layers 105L and eight insulating layers 114L are stacked in the order of the conductive layer 105L, the insulating layer 114L, . . . , the conductive layer 105L, and the insulating layer 114L. The conductive layer 105L is formed in a plate shape extending along the XY plane, for example. The eight stacked conductive layers 105L are used as the word lines WL0 to WL7 in order from the P-type well region 101 side. The conductive layer 105L contains, for example, tungsten.

The conductive layer 104L2, an insulating layer 115, and the conductive layer 104U are stacked in this order on the uppermost insulating layer 114L. The conductive layers 104L2 and 104U are formed in a plate shape extending along the XY plane, for example. The conductive layers 104L2 and 104U are used as the dummy word lines DWLL2 and DWLU, respectively. The conductive layers 104L2 and 104U contain, for example, tungsten.

An insulating layer 113U is provided on the conductive layer 104U. On the insulating layer 113U, eight conductive layers 105U and eight insulating layers 114U are stacked in the order of the conductive layer 105U, the insulating layer 114U, . . . , the conductive layer 105U, and the insulating layer 114U. The conductive layer 105U is formed in a plate shape extending along the XY plane, for example. The eight stacked conductive layers 105U are used as the word lines WL8 to WL15 in order from the P-type well region 101 side. The conductive layer 105U contains, for example, tungsten.

The conductive layer 106 and an insulating layer 116 are stacked in this order on the uppermost insulating layer 114U. The conductive layer 106 is formed in a plate shape extending along the XY plane, for example. The stacked conductive layer 106 is used as the select gate line SGD. The conductive layer 106 contains, for example, tungsten. The conductive layer 106 is electrically disconnected for each of the string units SU by, for example, a slit SHE.

A conductive layer 107 is provided on the insulating layer 116. The conductive layer 107 is formed in a line shape extending in the Y direction, for example, and is used as the bit line BL. That is, a plurality of the conductive layers 107 are arranged along the X direction in a region (not shown). The conductive layer 107 contains, for example, copper.

In the NAND flash memory 1, a memory pillar MP is provided so as to extend along the Z direction and penetrates the conductive layers 103 to 106. Further, each of the memory pillars MP has a first portion formed in a hole LMH on a lower layer and a second portion formed in a hole UMH on an upper layer.

Specifically, the first portion corresponding to the hole LMH penetrates the conductive layers 103, 104L0 to 104L2, and 105L, and has a bottom portion in contact with the P-type well region 101. The second portion corresponding to the hole UMH is provided above the first portion corresponding to the hole LMH and penetrates the conductive layers 104U, 105U, and 106. A layer including a boundary portion between the first portion and the second portion of the memory pillar MP, that is, a wiring layer provided with the insulating layer 115 is also called a bonding layer.

Each of the memory pillars MP includes, for example, a semiconductor layer 121, a block insulating film 122, an insulating film 123, and a tunnel insulating film 124. For example, each of the semiconductor layer 121, the block insulating film 122, the insulating film 123, and the tunnel insulating film 124 is continuously provided between the first portion and the second portion of the memory pillar MP.

The semiconductor layer 121 is provided, for example, by extending along the Z direction. Specifically, an upper end of the semiconductor layer 121 is included in an upper layer than the conductive layer 106, and a lower end of the semiconductor layer 121 is in contact with the P-type well region 101. The tunnel insulating film 124 covers a side surface of the semiconductor layer 121. The insulating film 123 covers a side surface of the tunnel insulating film 124. The block insulating film 122 covers a side surface of the insulating film 123.

The insulating film 123 includes, for example, an insulating film having a trap level (for example, a SiN film). Note that the insulating film 123 may include a semiconductor film (for example, a silicon film). In a case where the insulating film 123 includes the semiconductor film, the semiconductor films are separated from each other for each of the memory cell transistors MT.

The semiconductor layer 121 includes, for example, amorphous silicon or polysilicon. The semiconductor layer 121 may include, for example, a columnar insulator (silicon oxide or the like) and a semiconductor region covering a side surface of the columnar insulator.

Note that the semiconductor layer 121 may have a tapered cross-sectional shape in, for example, each of the first portion and the second portion of the memory pillar MP due to the manufacturing process of the memory cell array 10. In this case, the dimension (diameter) of a lower part of the first portion and the second portion in the X direction (and the Y direction) is smaller than the dimension (diameter) of an upper part of the first portion and the second portion in the X direction (and the Y direction), respectively.

In the structure of the memory pillar MP described above, a portion where the memory pillar MP and the conductive layer 103 intersect functions as the select transistor ST2. Further, each of a portion where the memory pillar MP and the conductive layer 105L intersect and a portion where the memory pillar MP and the conductive layer 105U intersect functions as the memory cell transistor MT. Further, a portion where the memory pillar MP and the conductive layer 104L0 intersect, a portion where the memory pillar MP and the conductive layer 104L1 intersect, a portion where the memory pillar MP and the conductive layer 104L2 intersect, and a portion where the memory pillar MP and the conductive layer 104U intersect function as the dummy cell transistors DTL0, DTL1, DTL2, and DTU, respectively. Further, a portion where the memory pillar MP and the conductive layer 106 intersect functions as the select transistor ST1. Further, the semiconductor layer 121 functions as a channel of each of the memory cell transistors MT0 to MT15, the dummy cell transistors DTL0 to DTL2, and the DTU, and the select transistors ST1 and ST2. Further, the insulating film 123 functions as a charge storage layer of the memory cell transistor MT and the dummy cell transistor DT.

A columnar contact CV is provided on the semiconductor layer 121 in the memory pillar MP. The contact CV is in contact with one of the conductive layers 107, that is, one of the bit lines BL on an upper surface of the contact CV.

Note that the structure shown in FIG. 4 is just an example, and other structures can be appropriately applied. For example, a conductor (not shown) that functions as the source line CELSRC may be further provided above the semiconductor substrate 100 shown in FIG. 4.

1.1.6 Threshold Voltage of Dummy Cell Transistor

Figures 5, 6:
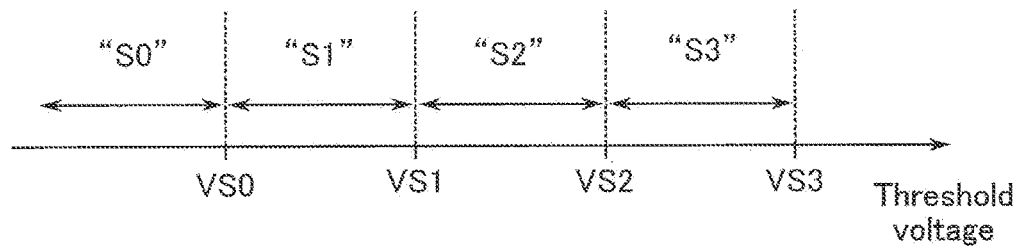
FIG. 5 is a diagram for explaining a threshold voltage that may be taken by a dummy cell transistor in the semiconductor memory device according to the first embodiment.
FIG. 6 is a diagram showing an example of a state of the threshold voltage set for the dummy cell transistor of the semiconductor memory device according to the first embodiment.

The threshold voltage of the dummy cell transistor DT of the NAND flash memory 1 according to the first embodiment will be described with reference to FIG. 5. FIG. 5 is a diagram for explaining the threshold voltage that the dummy cell transistor DT may take.

The dummy cell transistor DT may take four states having different threshold voltages, for example. Hereinafter, these four states are referred to as an "S0" state, an "S1" state, an "S2" state, and an "S3" state in ascending order of the threshold voltage.

The threshold voltage of the dummy cell transistor DT that takes the "S0" state is smaller than a voltage VS0. In this manner, the dummy cell transistor DT that takes the "S0" state is set to an on state by application of the voltage VS0 or higher to a corresponding dummy word line.

The threshold voltage of the dummy cell transistor DT that takes the "S1" state is the voltage VS0 or higher, and lower than a voltage VS1 (where VS1>VS0). In this manner, the dummy cell transistor DT that takes the "S1" state is set to an on state by application of the voltage VS1 or higher to a corresponding dummy word line.

The threshold voltage of the dummy cell transistor DT that takes the "S2" state is the voltage VS1 or higher, and lower than a voltage VS2 (where VS2 >VS1). In this manner, the dummy cell transistor DT that takes the "S2" state is set to an on state by application of the voltage VS2 or higher to a corresponding dummy word line.

The threshold voltage of the dummy cell transistor DT that takes the "S3" state is the voltage VS2 or higher, and lower than a voltage VS3 (where VS3 >VS2). In this manner, the dummy cell transistor DT that takes the "S3" state is set to an on state by application of the voltage VS3 or higher to a corresponding dummy word line.

In the first embodiment, the state of the threshold voltage of the dummy cell transistor DT is preset to one of the "S0" state to the "S3" state, for example, before the product is shipped.

FIG. 6 is a diagram showing an example of the state of the threshold voltage set to the dummy cell transistor DT.

In FIG. 6, the dummy cell transistor DT identified in a matrix by the string unit SU designated in the column direction and the dummy word line DWL designated in the row direction, and the state of the threshold voltage set to the dummy cell transistor DT are shown in a format of "(sign of dummy cell transistor)/(state of threshold voltage)".

Dummy cell transistors DTU_0 to DTU_3 are set to, for example, the "S0" state, the "S1" state, the "S2" state, and the "S3" state, respectively. In this case, dummy cell transistors DTL2_0 to DTL2_3 are set to the "S3" state, the "S2" state, the "S1" state, and the "S0" state, respectively. Note that the dummy cell transistors DTU_0 to DTU_3 may be set to the "S3" state, the "S2" state, the "S1" state, and the "S0" state, respectively. In this case, the dummy cell transistors DTL2_0 to DTL2_3 are set to the "S0" state, the "S1" state, the "S2" state, and the "S3" state, respectively.

Dummy cell transistors DTL1_0 to DTL1_3 are set to, for example, the "S0" state, the "S1" state, the "S2" state, and the "S3" state, respectively. In this case, dummy cell transistors DTL0_0 to DTL0_3 are set to the "S3" state, the "S2" state, the "S1" state, and the "S0" state, respectively. Note that the dummy cell transistors DTL1_0 to DTL1_3 may be set to the "S3" state, the "S2" state, the "S1" state, and the "S0" state, respectively. In this case, the dummy cell transistors DTL0_0 to DTL0_3 are set to the "S0" state, the "S1" state, the "S2" state, and the "S3" state, respectively.

1.2 Reading Operation

Next, an example of the reading operation according to the first embodiment will be described.

In the present embodiment, the dummy cell transistor DT is used as a select transistor for controlling the electrical connection between the string unit SU and the bit line BL or the source line CELSRC. More specifically, the NAND flash memory 1 according to the first embodiment controls voltage applied to the gate of the dummy cell transistor DT, so as to apply voltage to the first portion or the second portion of the memory pillar MP in the non-selection string unit SU while setting the other portion to a floating state.

Note that, in the description below, in order to simplify the description, a case where one-bit data is read in one time of the reading operation will be described.

1.2.1 Example of Reading Operation

Regarding the reading operation according to the first embodiment, description will be made by exemplifying a case where the reading operation of the memory cell transistor MT0 of the string unit SU1 is executed (operation example 1-1) and a case where the reading operation of the memory cell transistor MT8 of the string unit SU1 is executed (operation example 1-2).

Note that, in description below, the memory cell transistor MT for which the reading operation is to be performed is referred to as a selected memory cell transistor MT. Further, the word line WL corresponding to the selected memory cell transistor MT will be referred to as a selected word line WL.

1.2.1.1 Operation Example 1-1

The operation example 1-1 of the reading operation according to the first embodiment will be described.

Figure 7:
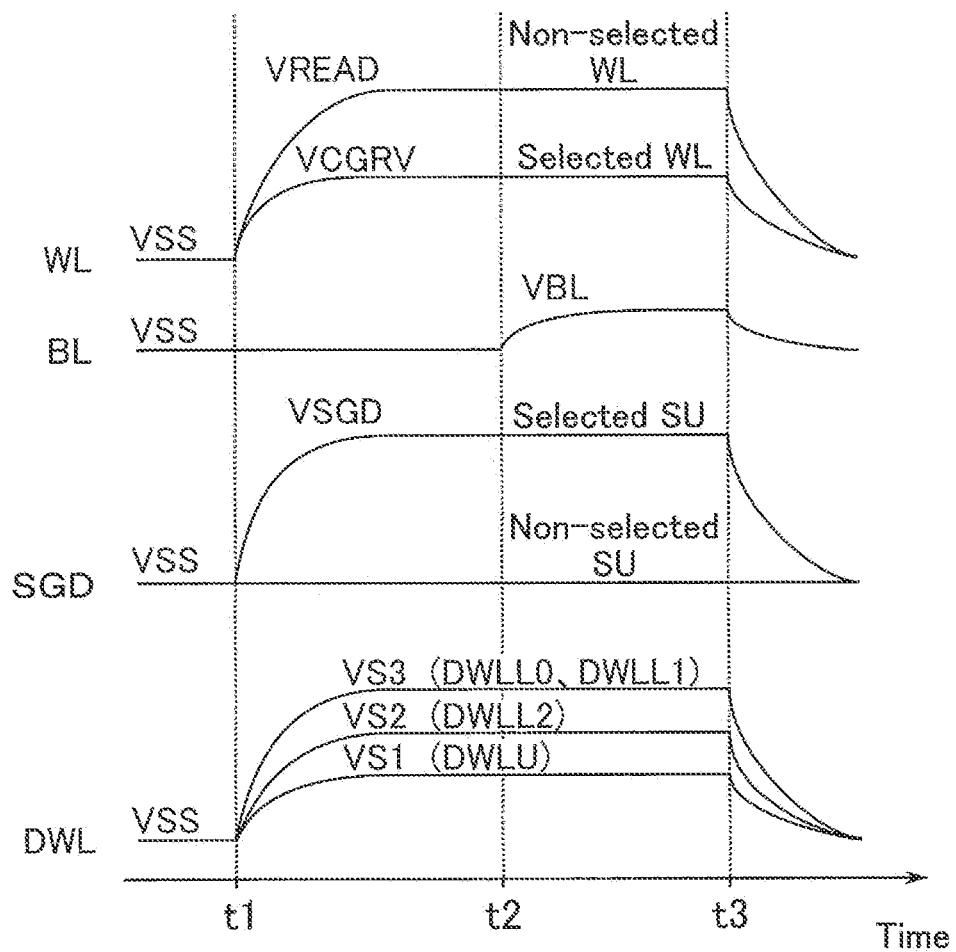
FIG. 7 is a timing chart showing a voltage of each wiring in reading operation (operation example 1-1) using the semiconductor memory device according to the first embodiment.

FIG. 7 is a timing chart showing a voltage of each wiring during the reading operation.

In FIG. 7, as described above, as the operation example 1-1, a case where data is read from the memory cell transistor MT0 included in the first portion of the memory pillar MP of the string unit SU1 is shown.

As shown in FIG. 7, first, at time t1, the row decoder 20 applies a voltage VSGD to the select gate line SGD1 and applies a voltage VSS to the select gate lines SGD0, SGD2, and SGD3. In this manner, a select transistor ST1_1 of the string unit SU1 is in an on state, and select transistors ST1_0, ST1_2, and ST1_3 of the string units SU0, SU2, and SU3 are in an off state. Further, the row decoder 20 applies a voltage equivalent to, for example, the voltage VSGD to the select gate line SGS to set the select transistor ST2 to an on state. The voltage VSGD is a voltage applied to the select gate lines SGD and SGS during the data reading operation to set the corresponding select transistors ST1 and ST2 to an on state.

Further, the row decoder 20 applies the voltage VS1 to the dummy word line DWLU. In this manner, the dummy cell transistors DTU_0 and DTU_1 are in an on state, and the dummy cell transistors DTU_2 and DTU_3 are in an off state.

Further, the row decoder 20 applies a voltage VS2 to the dummy word line DWLL2. In this manner, the dummy cell transistors DTL2_1 to DTL2_3 are in an on state, and the dummy cell transistor DTL2_0 is in an off state.

Further, the row decoder 20 applies a voltage VS3 to the dummy word lines DWLL0 and DWLL1. In this manner, the dummy cell transistors DTL0 and DTL1 of all the string units SU are in an on state.

Further, the row decoder 20 applies a voltage VREAD to the non-selected word lines WL1 to WL15 and applies a voltage VCGRV to the selected word line WL0. The voltage VREAD is a voltage that is applied to the non-selected word line WL during the data reading operation to set the corresponding memory cell transistor MT to an on state. Further, the voltage VCGRV is a voltage corresponding to the threshold voltage of the memory cell transistor MT for which the reading operation is to be performed. The voltage VCGRV and the voltage VREAD are in a relationship of VCGRV <VREAD. For example, in a case where the threshold voltage of the memory cell transistor MT for which the reading operation is to be performed is higher than the voltage VCGRV, the memory cell transistor MT is in an off state, and in a case where the threshold voltage is equal to or less than the voltage VCGRV, the memory cell transistor MT is in an on state.

At time t2, the sense amplifier 30 sets the voltage of the bit line BL to a voltage VBL.

The sense amplifier 30 senses and amplifies the cell current flowing through the bit line BL after the voltage of the selected word line WL0 is stabilized at the voltage VCGRV, and reads out data.

At time t3, the row decoder 20 applies the voltage VSS to all the dummy word lines DWL, all the word lines WL, and all the select gate lines SGD. Further, the sense amplifier 30 applies the voltage VSS to the bit line BL.

As described above, data is read from the memory cell transistor MT0 of the selected string unit SU1.

Figure 8:
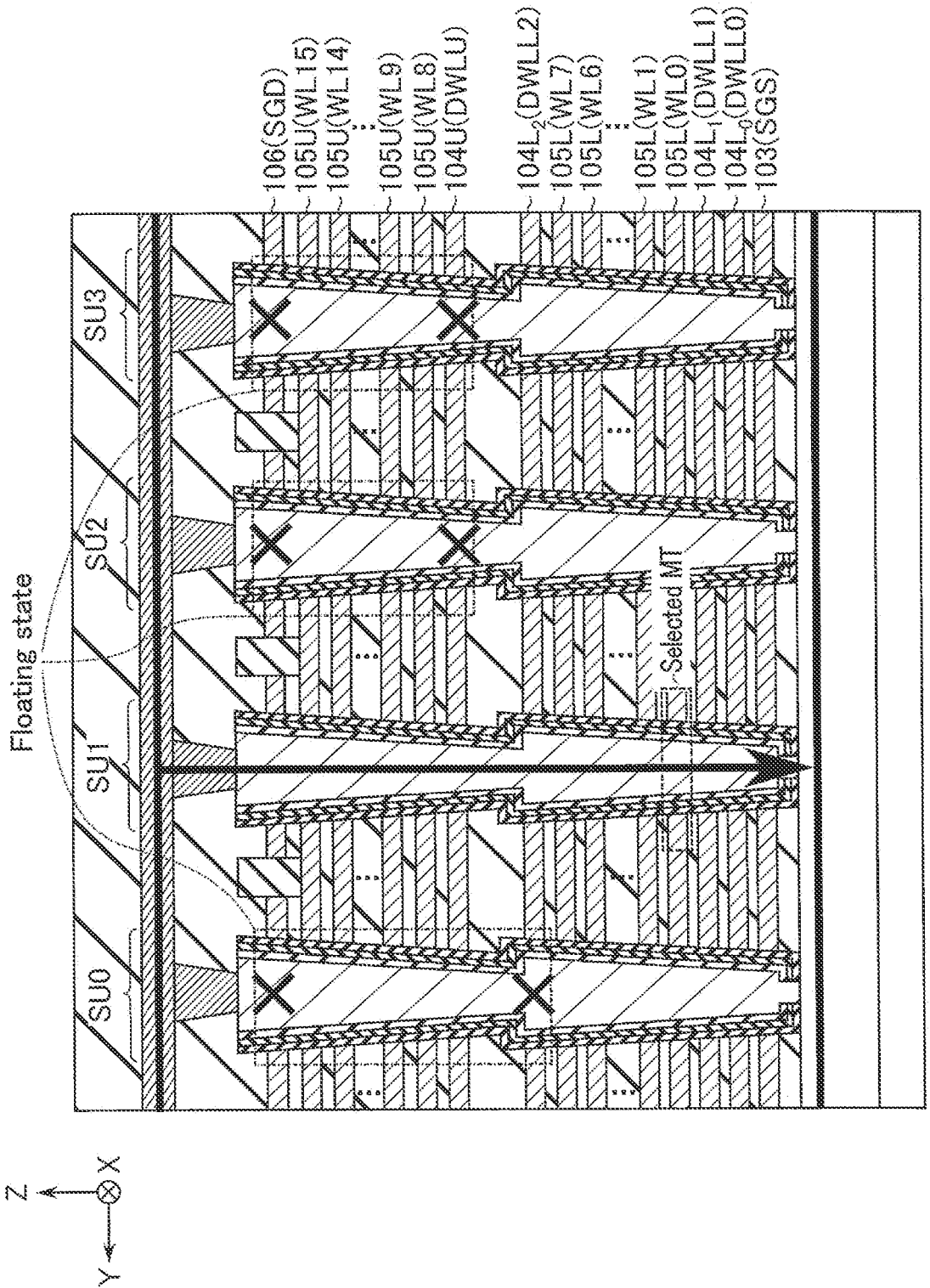
FIG. 8 is a diagram for explaining the electrical connection between each string unit and a bit line and between each string unit and a source line in the reading operation (operation example 1-1) using the semiconductor memory device according to the first embodiment.

FIG. 8 is a diagram for explaining the electrical connection between each string unit SU and the bit line BL and between each string unit SU and the source line CELSRC during the reading operation shown in FIG. 7. In FIG. 8, the select transistor ST1 and the dummy cell transistor DT, which are in an off state during the reading operation, are marked with "x".

As shown in FIG. 8, in the selected string unit SU1, all the dummy cell transistors DT(DTU_1, DTL2_1, DTL1_1, and DTL0_1 each corresponding to the dummy word lines DWLU, DWLL2, DWLL1, and DWLL0) are in an on state, so that the memory pillar MP can function as a current path between the bit line BL and the source line CELSRC.

In contrast, in the non-selected string units SU0, SU2, and SU3, both the dummy cell transistors DTL0 and DTL1 are in an on state, and any one of the dummy cell transistors DTL2 and DTU is in an off state. For this reason, a channel of the memory cell transistors MT0 to MT7 (corresponding to the conductive layer 105L) located below the dummy cell transistors DTL2 and DTU in the memory pillar MP is electrically connected to the source line CELSRC. In contrast, in the memory pillar MP, a channel of the memory cell transistors MT8 to MT15 located above the dummy cell transistors DTL2 and DTU (the region enclosed by the alternate long and short dash line in FIG. 8) is in a floating state, in which the channel is electrically insulated from the bit line BL and the source line CELSRC.

Note that, although the case where the memory cell transistor MT0 is selected is described in FIGS. 7 and 8, the reading operation equivalent to that in the above description can be applied to the case where the memory cell transistors MT1 to MT7 located below the dummy cell transistors DTL2 and DTU are selected.

1.2.1.2 Operation Example 1-2

Next, the operation example 1-2 of the reading operation according to the first embodiment will be described.

Figure 9:
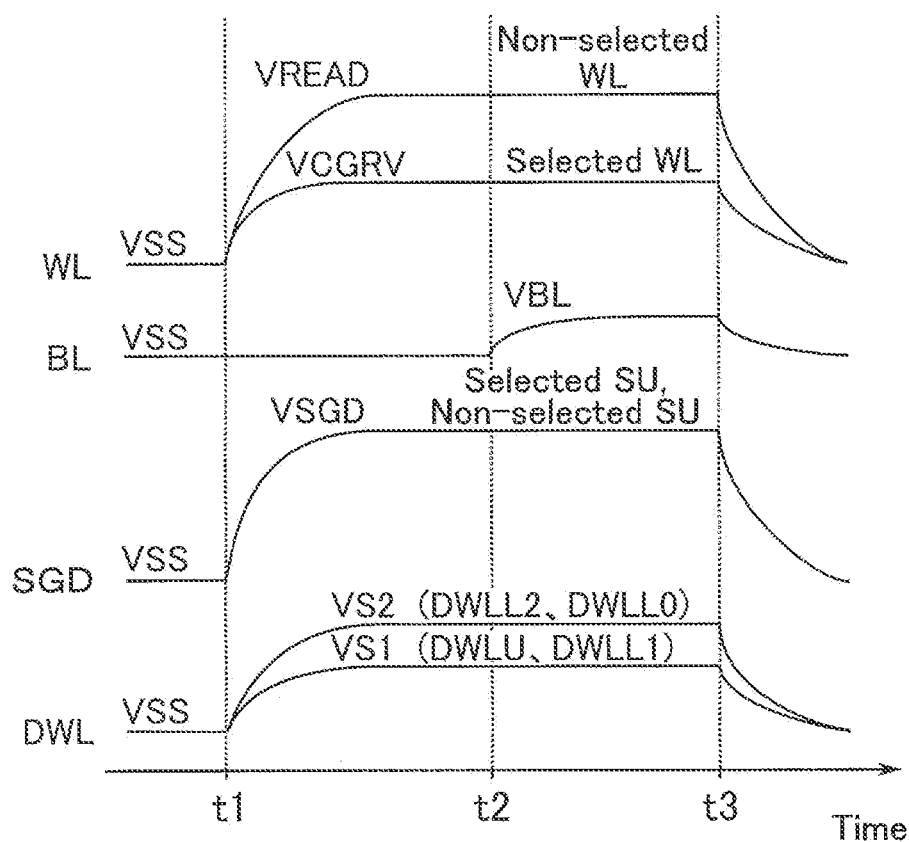
FIG. 9 is a timing chart showing a voltage of each wiring in reading operation (operation example 1-2) using the semiconductor memory device according to the first embodiment.

FIG. 9 is a timing chart showing a voltage of each wiring during the reading operation.

In FIG. 9, as described above, as the operation example 1-2, a case where data is read from the memory cell transistor MT8 included in the second portion of the memory pillar MP of the string unit SU1 is shown.

Hereinafter, description of the same operation as the operation example 1-1 will be omitted, and operation different from the operation example 1-1 will be mainly described.

As shown in FIG. 9, at time t1, the row decoder 20 applies the voltage VSGD to the select gate lines SGD0 to SGD3 of all the string units SU. In this manner, the select transistors ST1 of all the string units SU0 to SU3 are in an on state.

Further, the row decoder 20 applies the voltage VS1 to the dummy word lines DWLU and DWLL1. In this manner, the dummy cell transistors DTU_0, DTU_1, DTL1_0, and DTL1_1 are in an on state, and the dummy cell transistors DTU_2, DTU_3, DTL1_2, and DTL1_3 are in an off state.

Further, the row decoder 20 applies the voltage VS2 to the dummy word lines DWLL2 and DWLL0. In this manner, the dummy cell transistors DTL2_1 to DTL2_3 and DTL0_1 to DTL0_3 are in an on state, and the dummy cell transistors DTL2_0 and DTL0_0 are in an off state.

Further, the row decoder 20 applies the voltage VREAD to the non-selected word lines WL0 to WL7 and WL9 to WL15, and applies the voltage VCGRV to the selected word line WL8.

The operation at time t2 and t3 is equivalent to that in the operation example 1-1, and will be omitted from the description.

As described above, data is read from the memory cell transistor MT8 of the selected string unit SU1.

Figure 10:
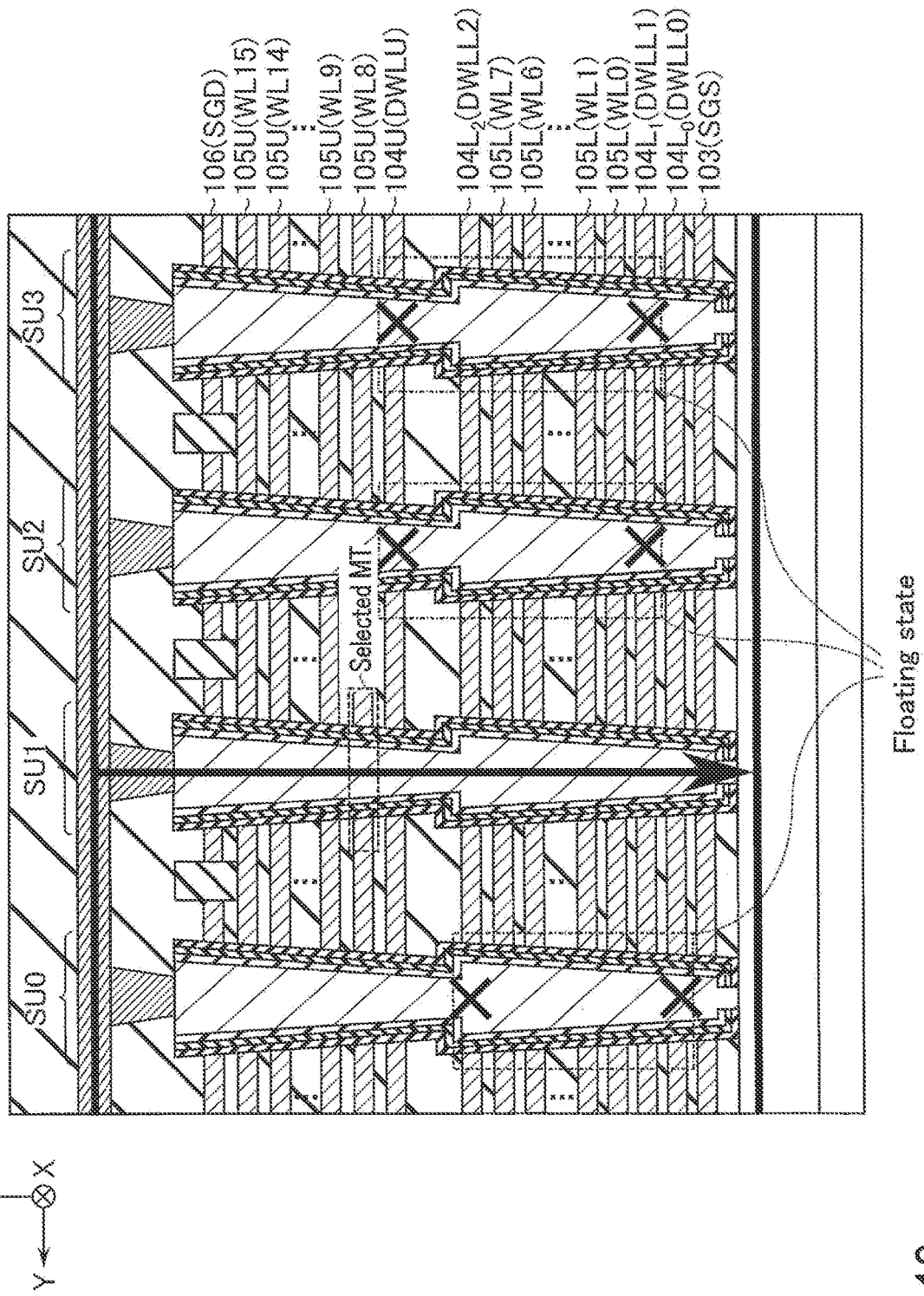
FIG. 10 is a diagram for explaining the electrical connection between each string unit and a bit line and between each string unit and a source line in the reading operation (operation example 1-2) using the semiconductor memory device according to the first embodiment.

FIG. 10 is a diagram for explaining the electrical connection between each string unit SU and the bit line BL and between each string unit SU and the source line CELSRC during the reading operation shown in FIG. 9. In FIG. 10, the select transistor ST1 and the dummy cell transistor DT, which are in an off state during the reading operation, are marked with "x".

As shown in FIG. 10, in the selected string unit SU1, all the dummy cell transistors DT are in an on state, so that the memory pillar MP can function as a current path between the bit line BL and the source line CELSRC.

In contrast, in the non-selected string units SU0, SU2, and SU3, any one of the dummy cell transistors DTL0 and DTL1 and any one of the dummy cell transistors DTL2 and DTU are in an off state. For this reason, a channel of the memory cell transistors MT8 to MT15 located above the dummy cell transistors DTL2 and DTU in the memory pillar MP is electrically connected to the bit line BL. In contrast, in the memory pillar MP, a channel of the memory cell transistors MT0 to MT7 located below the dummy cell transistors DTL2 and DTU (the region enclosed by the alternate long and short dash line in FIG. 10) is in a floating state, in which the channel is electrically insulated from the bit line BL and the source line CELSRC.

Note that, although the case where the memory cell transistor MT8 is selected is described in FIGS. 9 and 10, the reading operation equivalent to that in the above description can be applied to the case where the memory cell transistors MT9 to MT15 located above the dummy cell transistors DTL2 and DTU are selected.

1.2.2 Other Operation Examples

In the operation example 1-1 and the operation example 1-2 described above, the case where the reading operation of the memory cell transistor MT included in the string unit SU1 is executed is shown as an example.

Hereinafter, operation in a case where the threshold voltage of the memory cell transistor MT included in a first portion of the string unit SUi (i is an integer of 0 or more and 3 or less) is read, which is a generic concept of the operation example 1-1, and in a case where the threshold voltage of the memory cell transistor MT included in a second portion of the string unit SUi is read, which is a generic concept of the operation example 1-2, will be described.

1.2.2.1 Reading Operation of Memory Cell Transistor Included in First Portion

First, a case where the reading operation of the memory cell transistor MT included in the first portion of the memory pillar MP of the string unit SUi is executed will be described. Note that, since control of the voltage applied to the word line WL, the dummy word lines DWLL0 and DWLL1, the bit line BL, and the select gate line SGS is the same as that in the operation example 1-1, control of the dummy word lines DWLU and DWLL2 and the select gate line SGD will be mainly described.

The row decoder 20 applies the voltage VSGD to the select gate line SGD of the selected string unit SUi, and maintains application of the voltage VSS to the select gate line SGD of a non-selected string unit SUj1 (j1 is an integer 0 or more and 3 or less, different from i).

Further, the row decoder 20 applies a voltage VSi to the dummy word line DWLU. In this manner, a dummy cell transistor DTU_j2 (j2 is an integer of 0 or more and i or less) is in an on state, and a dummy cell transistor DTU_j3 (j3 is an integer larger than i and 3 or less) is in an off state. Note that, in a case where i is 3, all of the dummy cell transistors DTU are in an on state.

Further, the row decoder 20 applies a voltage VS(3−i) to the dummy word line DWLL2. In this manner, a dummy cell transistor DTL2_j4 (j4 is an integer of i or more and 3 or less) is in an on state, and a dummy cell transistor DTL2_j5 (j5 is an integer smaller than i and 0 or more) is in an off state. Note that, in a case where i is 0, all of the dummy cell transistors DTL2 are in an on state.

By the above operation, in the non-selected string unit SUj1, both the dummy cell transistors DTL0 and DTL1 can be set to an on state, and any one of the dummy cell transistors DTL2 and DTU can be set to an off state.

1.2.2.2 Reading Operation of Memory Cell Transistor Included in Second Portion

Next, a case where the reading operation of the memory cell transistor MT included in the second portion of the memory pillar MP of the string unit SUi is executed will be described. Note that, since control of the voltage applied to the word line WL, the bit line BL, and the select gate lines SGD and SGS is the same as that in the operation example 1-2, control of the dummy word line DWL will be mainly described.

The row decoder 20 applies the voltage VSi to the dummy word lines DWLU and DWLL1. In this manner, dummy cell transistors DTU_j6 and DTL1_j6 (j6 is an integer of 0 or more and i or less) are in an on state, and dummy cell transistors DTU_j7 and DTL1_j7 (j7 is an integer larger than i and 3 or less) are in an off state. Note that, in a case where i is 3, all of the dummy cell transistors DTU and DTL1 are in an on state.

Further, the row decoder 20 applies the voltage VS(3−i) to the dummy word lines DWLL2 and DWLL0. In this manner, dummy cell transistors DTL2_j8 and DTL0_j8 (j8 is an integer of i or more and 3 or less) are in an on state, and dummy cell transistors DTL2_j9 and DTL0_j9 (j9 is an integer less than i and 0 or more) are in an off state. Note that, in a case where i is 0, all of the dummy cell transistors DTL2 and DTL0 are in an on state.

By the above operation, in the non-selected string unit SUj1, any one of the dummy cell transistors DTL0 and DTL1 and any one of the dummy cell transistors DTL2 and DTU are in an off state.

1.3 Effect of First Embodiment

According to the first embodiment, the characteristics of the reading operation of the semiconductor memory device can be improved. An effect of the first embodiment will be described below.

As described above, in the first embodiment, each of the memory pillars MP includes the dummy cell transistors DTL0 to DTL2 included in the first portion and the dummy cell transistor DTU included in the second portion. In the first embodiment, each of the threshold voltages of the dummy cell transistors DTL0 to DTL2 and DTU is preset to a predetermined state different between each of the string units SU before the reading operation. In this manner, the NAND flash memory 1 of the first embodiment can make at least one channel connected to the non-selected word line WL in a floating state in the non-selected string unit SU during the reading operation. For this reason, it is not necessary to charge the memory cell transistor MT in a floating state via the bit line BL or the source line CELSRC, and it is possible to suppress an increase in the charging capacity of the bit line BL or the source line CELSRC. Therefore, the charging speed can be improved and an increase in the charging current can be suppressed.

Further, during the reading operation, the NAND flash memory 1 of the first embodiment can electrically connect, in the non-selected string unit SU, channels of the memory cell transistor MT connected to the selected word line WL and the memory cell transistor MT connected to the non-selected word line WL adjacent to the selected word line WL to the bit line BL or the source line CELSRC. In this manner, it is possible to prevent a fluctuation of the threshold voltage due to an unintended voltage difference between the gate and the source of the memory cell transistor MT in the non-selected string unit SU. For this reason, the characteristics of the reading operation of the semiconductor memory device can be improved.

Note that, in the above description, the case of the reading operation is described as an example. However, the present embodiment is not limited to this, and can be also applied to the verify operation during the writing operation.

2. Second Embodiment

Next, a NAND flash memory 1 according to a second embodiment will be described. The second embodiment further includes two dummy cell transistors DTM0 and DTM1 and a memory cell transistor MT sandwiched between the two dummy cell transistors DTM0 and DTM1 in addition to the configuration of the first embodiment. In description below, the same configuration and operation as those of the first embodiment will be omitted from the description, and a configuration and operation different from those of the first embodiment will be mainly described.

2.1 Configuration

A configuration of the NAND flash memory 1 according to the second embodiment will be described.

2.1.1 Configuration of Memory Cell Array

A configuration of a memory cell array 10 according to the second embodiment will be described with reference to FIG. 11. FIG. 11 is a circuit diagram of the memory cell array 10 included in the NAND flash memory 1 according to the second embodiment.

In the memory cell array 10 according to the second embodiment, each of NAND strings NS includes 24 memory cell transistors MT (MT0 to MT23), two select transistors ST1 and ST2, and six dummy cell transistors DT (DTU, DTM0, DTM1, and DTL0 to DTL2). Note that, in description below, two of the dummy cell transistors DTM1 and DTM0 in a string unit SUi (i is an integer of 0 or more and 3 or less) are also referred to as dummy cell transistors DTM1_$i$ and DTM0_$i$, respectively.

Configurations of the dummy cell transistors DTL0 to DTL2 and the memory cell transistors MT0 to MT7 are the same as those of the NAND flash memory 1 according to the first embodiment.

The drain of the dummy cell transistor DTL2 is connected to the source of the dummy cell transistor DTM0.

The memory cell transistors MT8 to MT15 are connected in series between the dummy cell transistor DTM0 and the dummy cell transistor DTM1 in this order. The source of the memory cell transistor MT8 on one end side of this series connection is connected to the drain of the dummy cell transistor DTM0, and the drain of the memory cell transistor MT15 on the other end side is connected to the source of the dummy cell transistor DTM1.

The drain of the dummy cell transistor DTM1 is connected to the source of the dummy cell transistor DTU.

The control gates of the dummy cell transistors DTM1 and DTM0 in the same block BLK are common-connected to dummy word lines DWLM1 and DWLM0, respectively. However, the gates of the dummy cell transistors DTM1 and DTM0 may be connected to different dummy word lines for each of the string units SU.

Note that, in description hereinafter, the dummy word lines DWLM1 and DWLM0, together with dummy word lines DWLU and DWLL2 to DWLL0, are also collectively referred to as a dummy word line DWL.

Configurations of the dummy cell transistor DTU, the memory cell transistors MT16 to MT23, and the select transistor ST1 are equivalent to those in the NAND flash memory 1 according to the first embodiment except that the memory cell transistors MT16 to MT23 are provided instead of the memory cell transistors MT8 to MT15.

2.1.2 Structure of Memory Cell Array

Figure 12:
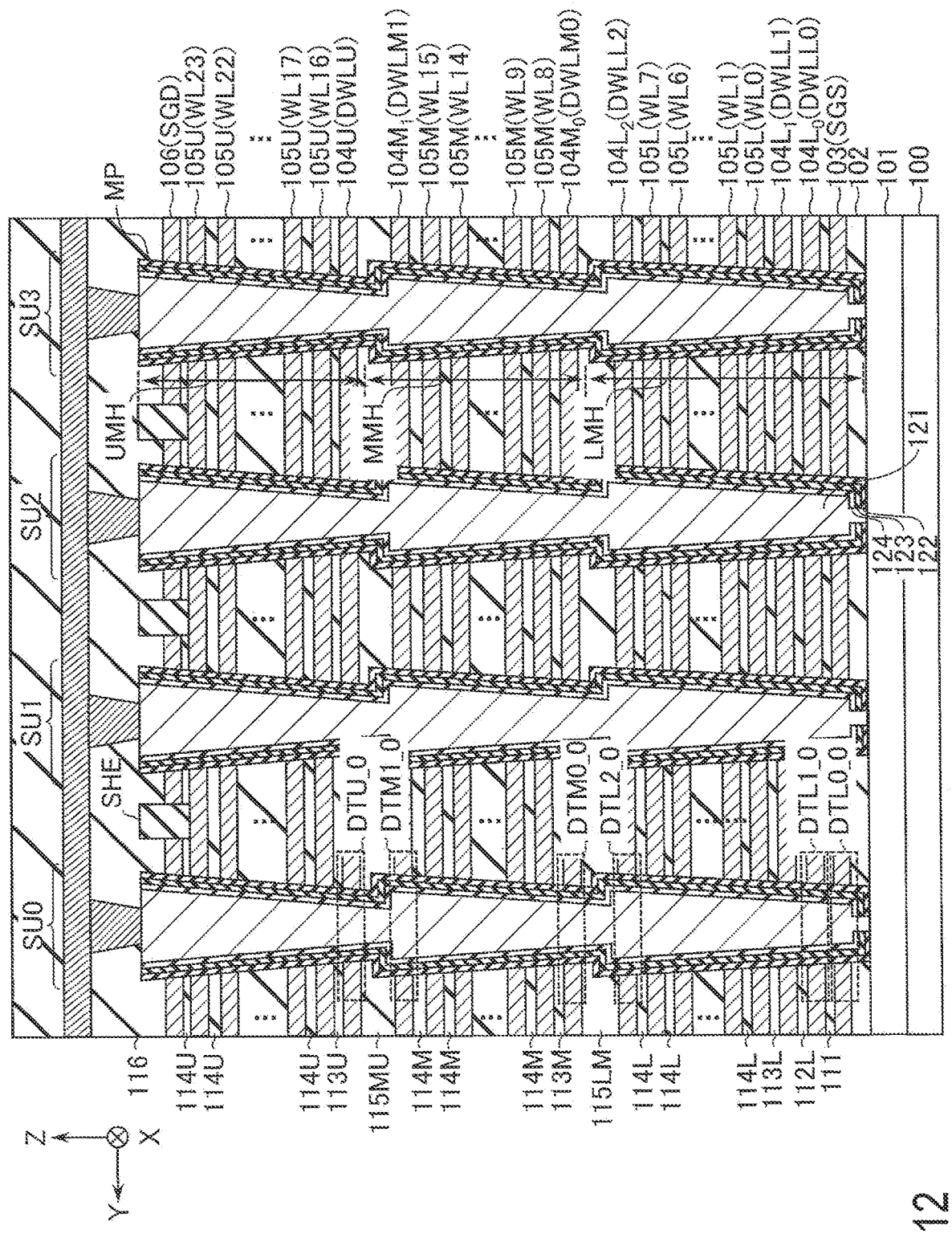
FIG. 12 is a cross-sectional view showing an example of a structure of the memory cell array in the semiconductor memory device according to the second embodiment.

A configuration of the memory cell array 10 according to the second embodiment will be described with reference to FIG. 12. FIG. 12 is a cross-sectional view showing an example of the structure of the memory cell array 10 in the NAND flash memory 1 according to the second embodiment.

In the NAND flash memory 1 according to the second embodiment, a conductive layer 104 includes one of each of conductive layers 104L0, 104L1, 104L2, 104M0, 104M1, and 104U. Further, a conductive layer 105 includes eight of each of conductive layers 105L, 105M, and 105U.

An insulating layer 102, a conductive layer 103, the conductive layers 104L0 and 104L1, the conductive layer 105L, and the conductive layer 104L2 are stacked on the P-type well region 101 in the same manner as in the first embodiment.

An insulating layer 115LM and the conductive layer 104M0 are stacked in this order on the conductive layer 104L2. The conductive layer 104M0 is formed in a plate shape extending along the XY plane, for example. The stacked conductive layer 104M0 is used as a dummy word line DWLM0. The conductive layer 104M0 contains, for example, tungsten.

An insulating layer 113M is provided on the conductive layer 104M0. On the insulating layer 113M, eight conductive layers 105M and eight insulating layers 114M are stacked in the order of the conductive layer 105M, the insulating layer 114M, the conductive layer 105M, . . . , and the insulating layer 114M. The eight stacked conductive layers 105M are used as word lines WL8 to WL15 in order from a P-type well region 101 side. The conductive layer 105M contains, for example, tungsten.

The conductive layer 104M1 and an insulating layer 115MU are stacked in this order on the uppermost insulating layer 114M. The conductive layer 104M1 is formed in a plate shape extending along the XY plane, for example. The stacked conductive layer 104M1 is used as a dummy word line DWLM1. The conductive layer 104M1 contains, for example, tungsten.

The conductive layer 104U, the conductive layer 105U, a conductive layer 106, an insulating layer 116, and a conductive layer 107 are stacked on the insulating layer 115MU in the same manner as in the first embodiment. Note that, in the second embodiment, the eight stacked conductive layers 105U are each used as word lines WL16 to WL23 in order from the P-type well region 101 side.

In the NAND flash memory 1 according to the second embodiment, a memory pillar MP penetrates the conductive layers 103 to 106. Further, each of the memory pillars MP has a first portion formed in a hole LMH on a lower layer, a second portion formed in a hole UMH on an upper layer, and a third portion formed in a hole MMH on a middle layer.

The first portion and the second portion have the equivalent structure to those of the first embodiment. The third portion is provided above the first portion and below the second portion and penetrates the conductive layers 104M0, 105M, and 104M1. A layer including a boundary portion between the first portion and the third portion of the memory pillar MP, and a layer including a boundary portion between the second portion and the third portion, that is, a wiring layer provided with the insulating layer 115LM and a wiring layer provided with the layer 115MU are also called a bonding layer.

Each of a semiconductor layer 121, a block insulating film 122, an insulating film 123, and a tunnel insulating film 124 is continuously provided between the first portion and the third portion of the memory pillar MP and the second portion and the third portion thereof.

2.1.3 Threshold Voltage of Dummy Cell Transistor

Next, a state of a threshold voltage taken by each dummy cell transistor DT of the NAND flash memory 1 according to the second embodiment will be described with reference to FIG. 13.

In the second embodiment, the state of the threshold voltage of the dummy cell transistor DT is preset to one of an "S0" state to an "S3" state, for example, before the product is shipped.

FIG. 13 is a diagram showing an example of the state of the threshold voltage set to the dummy cell transistor DT.

In FIG. 13, the dummy cell transistor DT identified in a matrix by the string unit SU designated in the column direction and the dummy word line DWL designated in the row direction, and the state of the threshold voltage set to the dummy cell transistor DT are shown in a format of "(sign of dummy cell transistor)/(state of threshold voltage)".

Note that, since the state of the threshold voltage of the dummy cell transistors DTU and DTL2 to DTL0 is the same as that of the first embodiment, only the state of the threshold voltage of the dummy cell transistors DTM0 and DTM1 will be described in description below.

Dummy cell transistors DTM1_0 to DTM1_3 are set to, for example, the "S0" state, the "S1" state, the "S2" state, and the "S3" state, respectively. In this case, dummy cell transistors DTM0_0 to DTM0_3 are set to the "S3" state, the "S2" state, the "S1" state, and the "S0" state, respectively. Note that the dummy cell transistors DTM1_0 to DTM1_3 may be set to the "S3" state, the "S2" state, the "S1" state, and the "S0" state, respectively. In this case, the dummy cell transistors DTM0_0 to DTM0_3 are set to the "S0" state, the "S1" state, the "S2" state, and the "S3" state, respectively.

2.2 Reading Operation

Next, reading operation according to the second embodiment will be described by taking as an example a case where the reading operation of the memory cell transistor MT of a string unit SU1 is executed. Hereinafter, description of operation which is the same as the reading operation according to the first embodiment will be omitted, and operation different from the reading operation according to the first embodiment will be mainly described.

Next, regarding the reading operation according to the second embodiment, description will be made by exemplifying a case where the reading operation of the memory cell transistor MT0 of the string unit SU1 is executed (operation example 2-1), a case where the reading operation of the memory cell transistor MT8 of the string unit SU1 is executed (operation example 2-2), and a case where the reading operation of the memory cell transistor MT16 of the string unit SU1 is executed (operation example 2-3).

2.2.1 Operation Example 2-1

The operation example 2-1 of the reading operation according to the second embodiment will be described.

Figure 14:
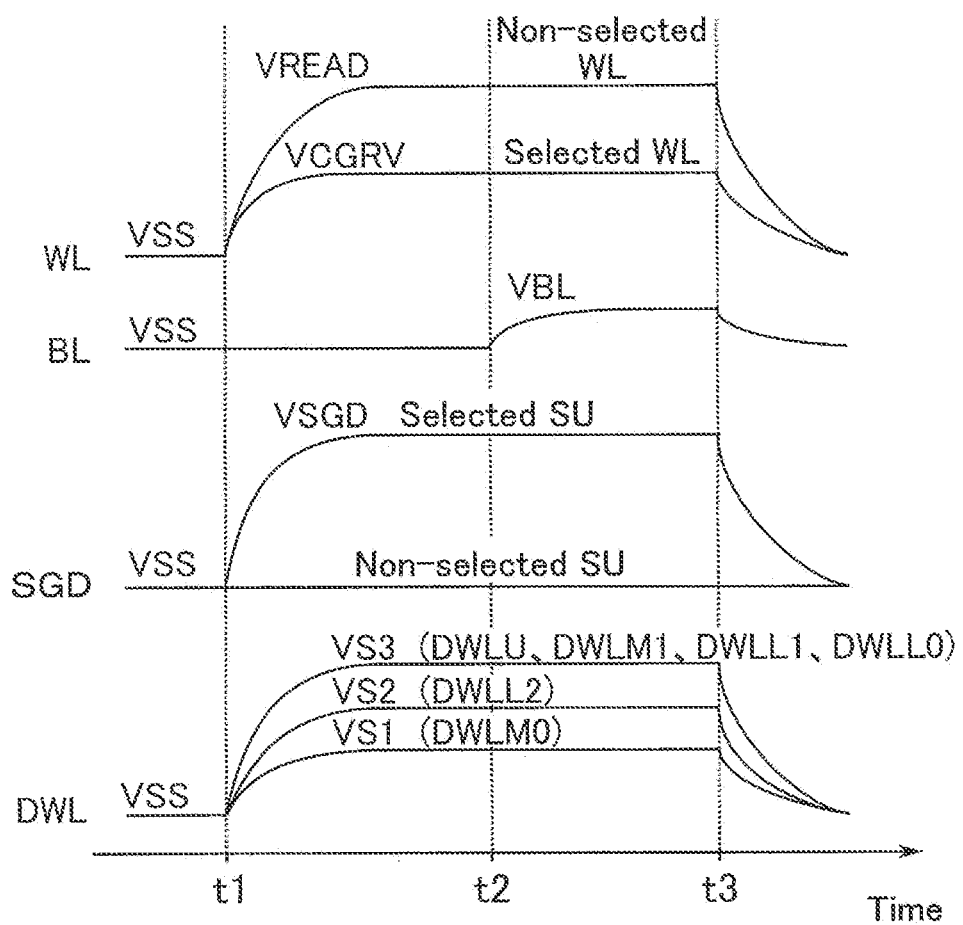
FIG. 14 is a timing chart showing a voltage of each wiring in reading operation (operation example 2-1) using the semiconductor memory device according to the second embodiment.

FIG. 14 is a timing chart showing a voltage of each wiring during the reading operation.

In FIG. 14, as described above, as the operation example 2-1, a case where data is read from the memory cell transistor MT0 included in the first portion of the memory pillar MP of the string unit SU1 is shown. As shown in FIG. 14, first, at time t1, a row decoder applies a voltage VSGD to a select gate line SGD1 and applies a voltage VSS to select gate lines SGD0, SGD2, and SGD3. In this manner, a select transistor ST1_1 of the string unit SU1 is in an on state, and select transistors ST1_0, ST1_2, and ST1_3 of the string units SU0, SU2, and SU3 are in an off state. Further, the row decoder 20 applies a voltage equivalent to, for example, the voltage VSGD to the select gate line SGS to set the select transistor ST2 to an on state.

Further, the row decoder 20 applies a voltage VS1 to the dummy word line DWLM0. In this manner, the dummy cell transistors DTM0_0 and DTM0_1 are in an on state, and the dummy cell transistors DTM0_2 and DTM0_3 are in an off state.

Further, the row decoder 20 applies a voltage VS2 to the dummy word line DWLL2. In this manner, the dummy cell transistors DTL2_1 to DTL2_3 are in an on state, and the dummy cell transistor DTL2_0 is in an off state.

Further, the row decoder 20 applies a voltage VS3 to the dummy word lines DWLU, DWLM1, DWLL1, and DWLL0. In this manner, all the dummy cell transistors DTU, DTM1, DTL1, and DTL0 are in an on state.

Further, the row decoder 20 applies a voltage VREAD to non-selected word lines WL1 to WL23 and applies a voltage VCGRV to a selected word line WL0.

The operation at time t2 and t3 is equivalent to that in the first embodiment, and will be omitted from the description.

As described above, data is read from the memory cell transistor MT0 of the selected string unit SU1.

Figure 15:
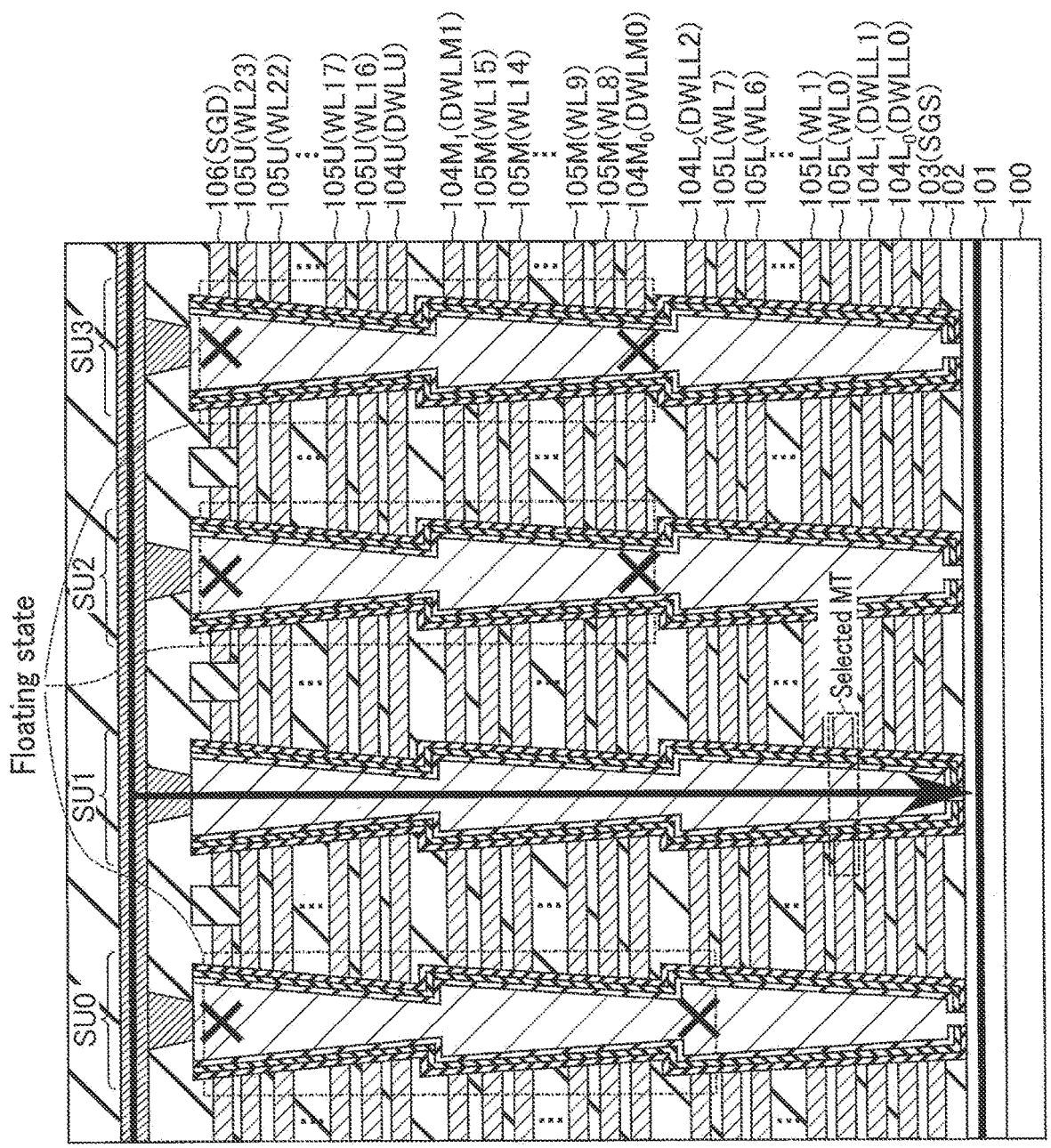
FIG. 15 is a diagram for explaining the electrical connection between each string unit and a bit line and between each string unit and a source line in the reading operation (operation example 2-1) using the semiconductor memory device according to the second embodiment.

FIG. 15 is a diagram for explaining the electrical connection between each string unit SU and a bit line BL and between each string unit and a source line CELSRC during the reading operation shown in FIG. 14. In FIG. 15, the select transistor ST1 and the dummy cell transistor DT, which are in an off state during the reading operation, are marked with "x".

As shown in FIG. 15, in the selected string unit SU1, all the dummy cell transistors DT(DTU_1, DTM1_1, DTM0_1, DTL2_1, DTL1_1, and DTL0_1 each corresponding to the dummy word lines DWLU, DWLM1, DWLM0, DWLL2, DWLL1, and DWLL0) are in an on state, so that the memory pillar MP can function as a current path between the bit line BL and the source line CELSRC.

In contrast, in non-selected string units SU0, SU2, and SU3, all the dummy cell transistors DTL0, DTL1, DTM1, and DTU are in an on state, and any one of the dummy cell transistors DTL2 and DTM0 is in an off state. For this reason, a channel of the memory cell transistors MT0 to MT7 located below the dummy cell transistors DTL2 and DTM0 in the memory pillar MP is electrically connected to the source line CELSRC. In contrast, in the memory pillar MP, a channel of the memory cell transistors MT8 to MT23 located above the dummy cell transistors DTL2 and DTM0 (the region enclosed by the alternate long and short dash line in FIG. 15) is in a floating state, in which the channel is electrically insulated from the bit line BL and the source line CELSRC.

Note that, although the case where the memory cell transistor MT0 is selected is described in FIGS. 14 and 15, the reading operation equivalent to that in the above description can be applied to the case where the memory cell transistors MT1 to MT7 located below the dummy cell transistors DTL2 and DTM0 are selected.

2.2.2 Operation Example 2-2

The operation example 2-2 of the reading operation according to the second embodiment will be described.

Figure 16:
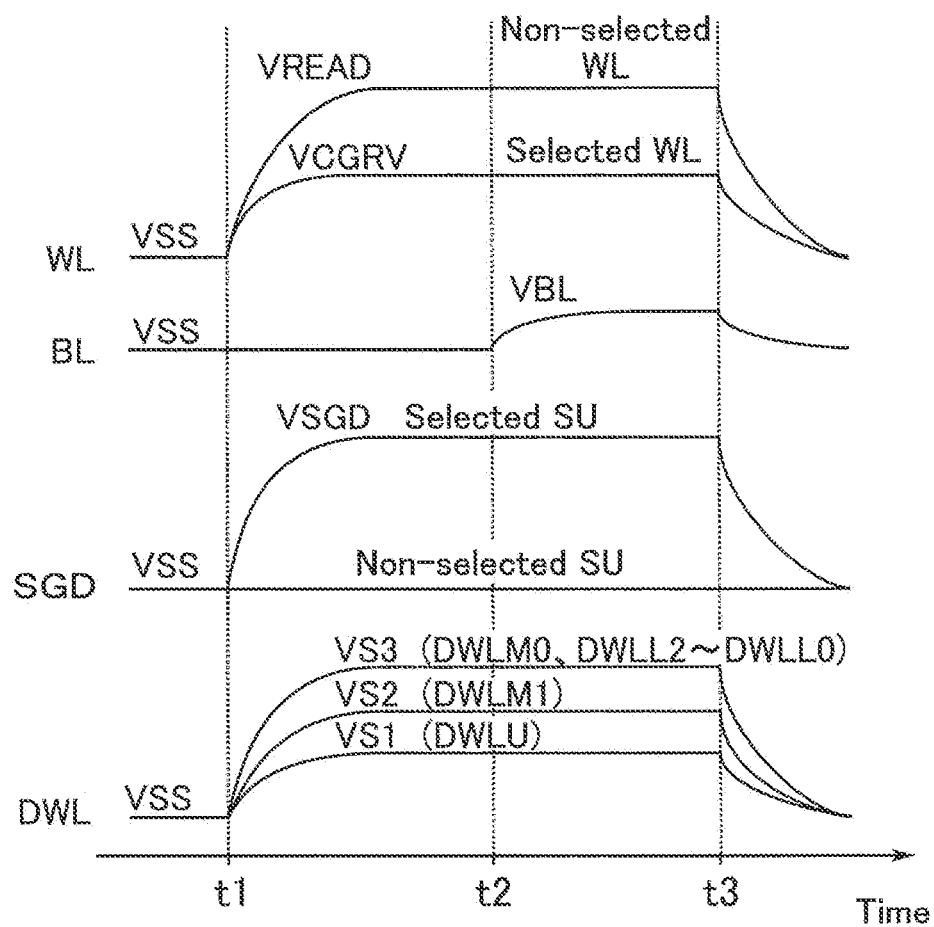
FIG. 16 is a timing chart showing a voltage of each wiring in the reading operation (operation example 2-2) using the semiconductor memory device according to the second embodiment.

FIG. 16 is a timing chart showing a voltage of each wiring during the reading operation.

In FIG. 16, as described above, as the operation example 2-2, a case where data is read from the memory cell transistor MT8 included in the third portion of the memory pillar MP of the string unit SU1 is shown.

Hereinafter, description of the same operation as the operation example 2-1 will be omitted, and operation different from the operation example 2-1 will be mainly described.

As shown in FIG. 16, at time t1, the row decoder 20 applies a voltage equivalent to that of operation example 2-1 to the select gate lines SGD and SGS.

Further, the row decoder 20 applies the voltage VS1 to the dummy word line DWLU. In this manner, the dummy cell transistors DTU_0 and DTU_1 are in an on state, and the dummy cell transistors DTU_2 and DTU_3 are in an off state.

Further, the row decoder 20 applies a voltage VS2 to the dummy word line DWLM1. In this manner, the dummy cell transistors DTM1_1 to DTM1_3 are in an on state, and the dummy cell transistor DTM1_0 is in an off state.

Further, the row decoder 20 applies a voltage VS3 to the dummy word lines DWLM0 and DWLL2 to DWLL0. In this manner, all the dummy cell transistors DTM0 and DTL2 to DTL0 are in an on state.

Further, the row decoder 20 applies the voltage VREAD to the non-selected word lines WL0 to WL7 and WL9 to WL23, and applies the voltage VCGRV to the selected word line WL8.

The operation at time t2 and t3 is equivalent to that in the operation example 2-1, and will be omitted from the description.

As described above, data is read from the memory cell transistor MT8 of the selected string unit SU1.

Figure 17:
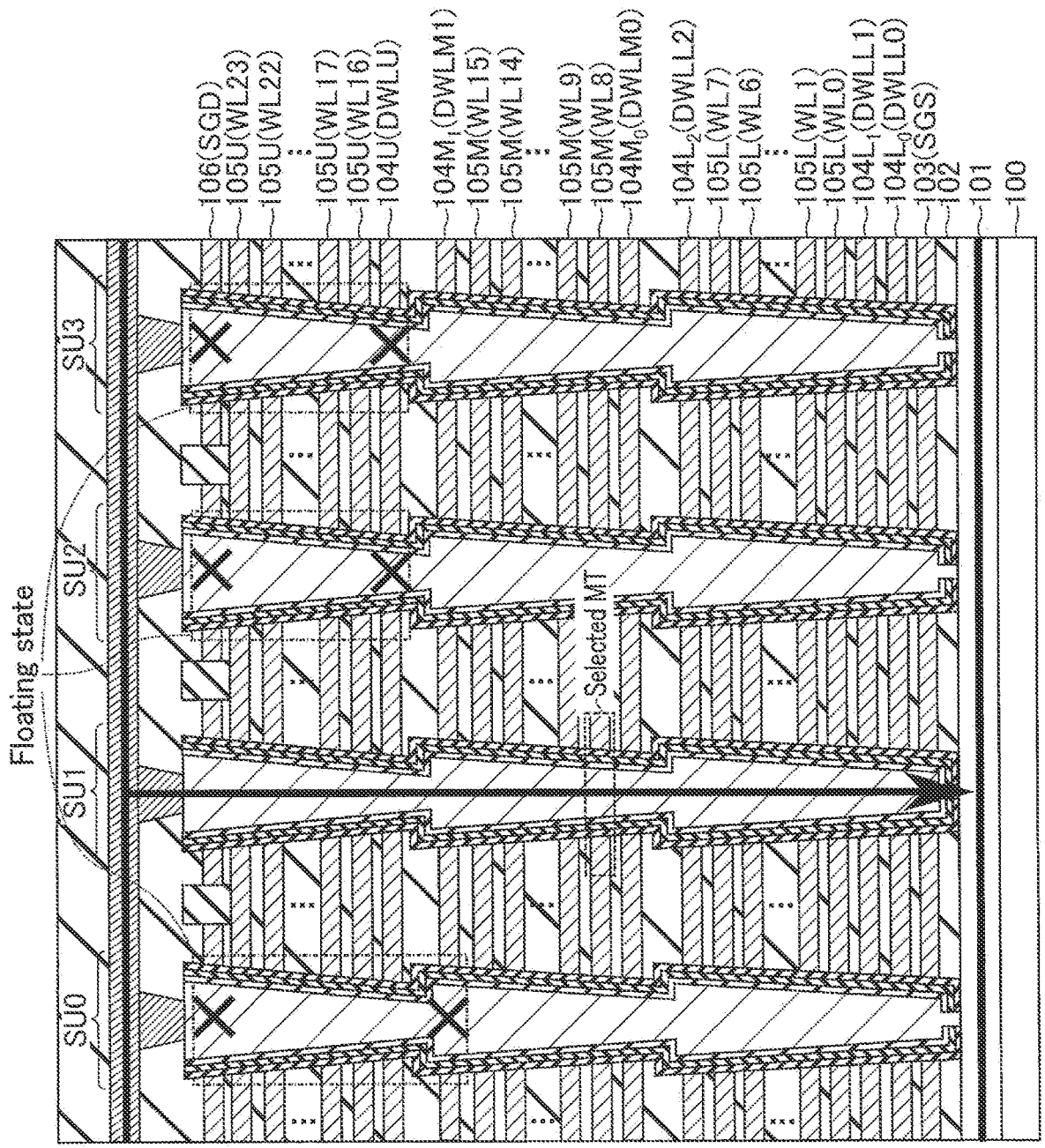
FIG. 17 is a diagram for explaining the electrical connection between each string unit and a bit line and between each string unit and a source line in the reading operation (operation example 2-2) using the semiconductor memory device according to the second embodiment.

FIG. 17 is a diagram for explaining the electrical connection between each string unit SU and the bit line BL and between each string unit and the source line CELSRC during the reading operation shown in FIG. 16. In FIG. 17, the select transistor ST1 and the dummy cell transistor DT, which are in an off state during the reading operation, are marked with "x".

As shown in FIG. 17, in the selected string unit SU1, all the dummy cell transistors DT are in an on state, so that the memory pillar MP can function as a current path between the bit line BL and the source line CELSRC.

In contrast, in the non-selected string units SU0, SU2, and SU3, all the dummy cell transistors DTL0, DTL1, DTL2, and DTM0 are in an on state, and any one of the dummy cell transistors DTU and DTM1 is in an off state. For this reason, a channel of the memory cell transistors MT0 to MT15 located below the dummy cell transistors DTU and DTM1 in the memory pillar MP is electrically connected to the source line CELSRC. In contrast, in the memory pillar MP, a channel of the memory cell transistors MT16 to MT23 located above the dummy cell transistors DTU and DTM1 (the region enclosed by the alternate long and short dash line in FIG. 17) is in a floating state, in which the channel is electrically insulated from the bit line BL and the source line CELSRC.

Note that, although the case where the memory cell transistor MT8 is selected is described in FIGS. 16 and 17, the reading operation equivalent to that in the above description can be applied to the case where the memory cell transistors MT9 to MT15 located below the dummy cell transistors DTU and DTM1 and above the dummy cell transistor DTM0 are selected.

2.2.3 Operation Example 2-3

Operation example 2-3 of the reading operation according to the second embodiment will be described.

FIG. 18 is a timing chart showing a voltage of each wiring during the reading operation.

In FIG. 18, as described above, as the operation example 2-3, a case where data is read from the memory cell transistor MT16 included in the second portion of the memory pillar MP of the string unit SU1 is shown.

Hereinafter, description of the same operation as the operation example 2-1 and the operation example 2-2 will be omitted, and operation different from the operation example 2-1 and the operation example 2-2 will be mainly described.

As shown in FIG. 18, at time t1, the row decoder 20 applies the voltage VSGD to the select gate lines SGD0 to SGD3 of all the string units SU. In this manner, the select transistors ST1 of all the string units SU0 to SU3 are in an on state.

Further, the row decoder 20 applies the voltage VS1 to the dummy word lines DWLU and DWLL1. In this manner, the dummy cell transistors DTU_0, DTU_1, DTL1_0, and DTL1_1 are in an on state, and the dummy cell transistors DTU_2, DTU_3, DTL1_2, and DTL1_3 are in an off state.

Further, the row decoder 20 applies the voltage VS2 to the dummy word lines DWLM1 and DWLL0. In this manner, the dummy cell transistors DTM1_1 to DTM1_3 and DTL0_1 to DTL0_3 are in an on state, and the dummy cell transistors DTM1_0 and DTL0_3 are in an off state.

Further, the row decoder 20 applies the voltage VS3 to the dummy word lines DWLM0 and DWLL2. In this manner, all the dummy cell transistors DTM0 and DTL2 are in an on state.

Further, the row decoder 20 applies the voltage VREAD to the non-selected word lines WL0 to WL15 and WL17 to WL23, and applies the voltage VCGRV to the selected word line WL16.

The operation at time t2 and t3 is equivalent to that in the operation example 2-1 and the operation example 2-2, and will be omitted from the description.

As described above, data is read from the memory cell transistor MT16 of the selected string unit SU1.

Figure 19:
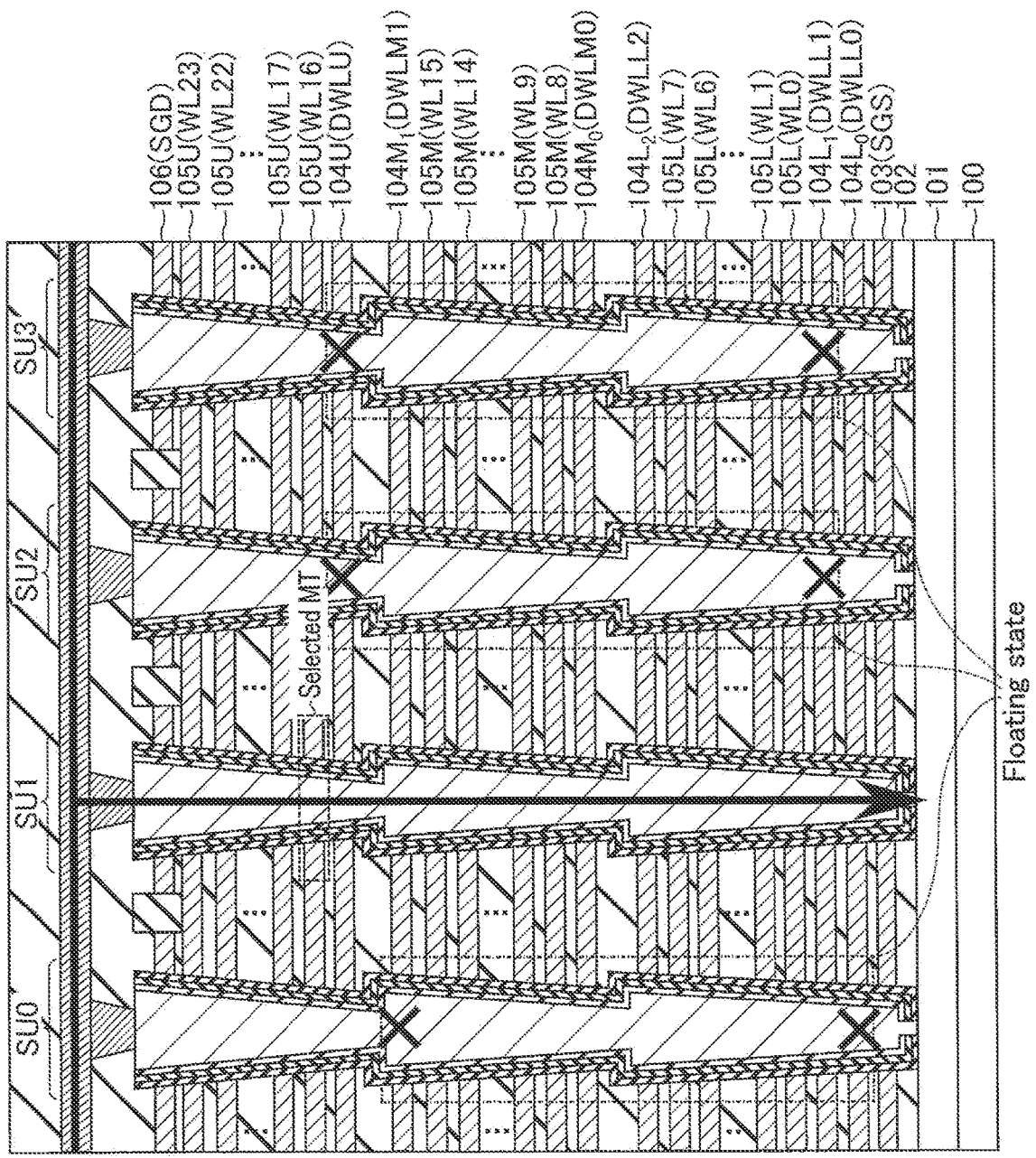
FIG. 19 is a diagram for explaining the electrical connection between each string unit and a bit line and between each string unit and a source line in the reading operation (operation example 2-3) using the semiconductor memory device according to the second embodiment.

FIG. 19 is a diagram for explaining the electrical connection between each string unit SU and the bit line BL and between each string unit and the source line CELSRC during the reading operation shown in FIG. 18. In FIG. 19, the select transistor ST1 and the dummy cell transistor DT, which are in an off state during the reading operation, are marked with "x".

As shown in FIG. 19, in the selected string unit SU1, all the dummy cell transistors DT are in an on state, so that the memory pillar MP can function as a current path between the bit line BL and the source line CELSRC.

In contrast, in the non-selected string units SU0, SU2, and SU3, all the dummy cell transistors DTM0 and DTL2 are in an on state, and any one of the dummy cell transistors DTU and DTM1 and any one of the dummy cell transistors DTL1 and DTL0 are in an off state. For this reason, a channel of the memory cell transistors MT16 to MT23 located above the dummy cell transistors DTU and DTM1 in the memory pillar MP is electrically connected to the bit line BL. In contrast, in the memory pillar MP, a channel of the memory cell transistors MT0 to MT15 located below the dummy cell transistors DTU and DTM1 (the region enclosed by the alternate long and short dash line in FIG. 19) is in a floating state, in which the channel is electrically insulated from the bit line BL and the source line CELSRC.

Note that, although the case where the memory cell transistor MT16 is selected is described in FIGS. 18 and 19, the reading operation equivalent to that in the above description can be applied to the case where the memory cell transistors MT17 to MT23 located above the dummy cell transistors DTU and DTM1 are selected.

2.2.4 Other Operation Examples

In the operation example 2-1, the operation example 2-2, and the operation example 2-3 described above, the case where the reading operation of the memory cell transistor MT included in the string unit SU1 is executed is shown as an example.

Hereinafter, operation in a case where the threshold voltage of the memory cell transistor MT included in a first portion of the string unit SUi (i is an integer of 0 or more and 3 or less) is read, which is a generic concept of the operation example 2-1, in a case where the threshold voltage of the memory cell transistor MT included in a third portion of the string unit SUi is read, which is a generic concept of the operation example 2-2, and in a case where the threshold voltage of the memory cell transistor MT included in a second portion of the string unit SUi is read, which is a generic concept of the operation example 2-3, will be described.

2.2.4.1 Reading Operation of Memory Cell Transistor Included in First Portion

First, a case where the reading operation of the memory cell transistor MT included in the first portion of the memory pillar MP of the string unit SUi is executed will be described. Note that, since control of the voltage applied to the word line WL, the dummy word lines DWLU, DWLM1, DWLL1, and DWLL0, the bit line BL, and the select gate line SGS is the same as that in the operation example 2-1, control of the dummy word lines DWLM0 and DWLL2 and the select gate line SGD will be mainly described.

The row decoder 20 applies the voltage VSGD to the select gate line SGD of the selected string unit SUi, and maintains application of the voltage VSS to the select gate line SGD in a non-selected string unit SUj10 (j10 is an integer 0 or more and 3 or less, different from i).

Further, the row decoder 20 applies a voltage VSi to the dummy word line DWLM0. In this manner, a dummy cell transistor DTM0_j11 (j11 is an integer of 0 or more and i or less) is in an on state, and a dummy cell transistor DTM0_j12 (j12 is an integer larger than i and 3 or less) is in an off state. Note that, in a case where i is 3, all of the dummy cell transistors DTM0 are in an on state.

Further, the row decoder 20 applies a voltage VS(3−i) to the dummy word line DWLL2. In this manner, a dummy cell transistor DTL2_j13 (j13 is an integer of i or more and 3 or less) is in an on state, and a dummy cell transistor DTL2_j14 (j14 is an integer smaller than i and 0 or more) is in an off state. Note that, in a case where i is 0, all of the dummy cell transistors DTL2 are in an on state.

By the above operation, in the non-selected string unit SUj10, all the dummy cell transistors DTL0, DTL1, DTM1, and DTU can be set to an on state, and any one of the dummy cell transistors DTL2 and DTM0 can be set to an off state.

2.2.4.2 Reading Operation of Memory Cell Transistor Included in Third Portion

Next, a case where the reading operation of the memory cell transistor MT included in the third portion of the memory pillar MP of the string unit SUi is executed will be described. Note that, since control of the voltage applied to the word line WL, the dummy word lines DWLM0 and DWLL2 to DWLL0, the bit line BL, and the select gate line SGS is the same as that in the operation example 2-2, control of the dummy word lines DWLU and DWLM1 and the select gate line SGD will be mainly described.

The row decoder 20 applies the voltage VSGD to the select gate line SGD of the selected string unit SUi, and maintains application of the voltage VSS to the select gate line SGD in a non-selected string unit SUj10.

Further, the row decoder 20 applies a voltage VSi to the dummy word line DWLU. In this manner, a dummy cell transistor DTU_j15 (j15 is an integer of 0 or more and i or less) is in an on state, and a dummy cell transistor DTU_j16 (j16 is an integer larger than i and 3 or less) is in an off state. Note that, in a case where i is 3, all of the dummy cell transistors DTU are in an on state.

Further, the row decoder 20 applies a voltage VS(3−i) to the dummy word line DWLM1. In this manner, a dummy cell transistor DTM1_j17 (j17 is an integer of i or more and 3 or less) is in an on state, and a dummy cell transistor DTM1_j18 (j18 is an integer smaller than i and 0 or more) is in an off state. Note that, in a case where i is 0, all of the dummy cell transistors DTM1 are in an on state.

By the above operation, in the non-selected string unit SUj10, all the dummy cell transistors DTL0, DTL1, DTL2, and DTM0 can be set to an on state, and any one of the dummy cell transistors DTM1 and DTU can be set to an off state.

Note that, in the reading operation of the memory cell transistor MT included in the third portion, operation below may be performed instead of the above reading operation. Hereinafter, since control of the voltage applied to the word line WL, the bit line BL, and the select gate line SGS is the same as the reading operation, control of the dummy word line DW and the select gate line SGD will be mainly described.

The row decoder 20 applies the voltage VSGD to the select gate lines SGD0 to SGD3 of all the string units SU. In this manner, the select transistors ST1 of all the string units SU0 to SU3 are in an on state.

Further, the row decoder 20 applies the voltage VSi to the dummy word lines DWLM0 and DWLL1. In this manner, dummy cell transistors DTM0_j19 and DTL1_j19 (j19 is an integer of 0 or more and i or less) is in an on state, and dummy cell transistors DTM0_j20 and DTL1_j20 (j20 is an integer larger than i and 3 or less) is in an off state. Note that, in a case where i is 3, all of the dummy cell transistors DTM0 and DTL1 are in an on state.

Further, the row decoder 20 applies the voltage VS(3−i) to the dummy word lines DWLL0 and DWLL2. In this manner, dummy cell transistors DTL0_j21 and DTL2_j21 (j21 is an integer of i or more and 3 or less) are in an on state, and dummy cell transistors DTL0_j22 and DTL2_j22 (j22 is an integer less than i and 0 or more) are in an off state. Note that, in a case where i is 0, all of the dummy cell transistors DTL0 and DTL2 are in an on state.

Further, the row decoder 20 applies the voltage VS3 to the dummy word lines DWLM1 and DWLU. In this manner, all the dummy cell transistors DTM1 and DTU are in an on state.

By the above operation, in the non-selected string unit SUj10, both the dummy cell transistors DTU and DTM1 can be set to an on state, and any one of the dummy cell transistors DTM0 and DTL2 and any one of the dummy cell transistors DTL1 and DTL0 can be set to an off state.

2.2.4.3 Reading Operation of Memory Cell Transistor Included in Second Portion

Next, a case where the reading operation of the memory cell transistor MT included in the second portion of the memory pillar MP of the string unit SUi is executed will be described. Note that, since control of the voltage applied to the word line WL, the dummy word lines DWLM0 and DWLL2, the bit line BL, and the select gate lines SGD and SGS is the same as that in the operation example 2-3, control of the dummy word lines DWLU, DWLM1, DWLL1, and DWL0 will be mainly described.

The row decoder 20 applies the voltage VSi to the dummy word lines DWLU and DWLL1. In this manner, dummy cell transistors DTU_j23 and DTL1_j23 (j23 is an integer of 0 or more and i or less) are in an on state, and dummy cell transistors DTU_j24 and DTL1_j24 (j24 is an integer larger than i and 3 or less) are in an off state. Note that, in a case where i is 3, all of the dummy cell transistors DTU and DTL1 are in an on state.

Further, the row decoder 20 applies the voltage VS(3−i) to the dummy word lines DWLM1 and DWLL0. In this manner, dummy cell transistors DTM1_j25 and DTL0_j25 (j25 is an integer of i or more and 3 or less) are in an on state, and dummy cell transistors DTM1_j26 and DTL0_j26 (j26 is an integer less than i and 0 or more) are in an off state. Note that, in a case where i is 0, all of the dummy cell transistors DTM1 and DTL0 are in an on state.

By the above operation, in the non-selected string unit SUj10, both the dummy cell transistors DTM0 and DTL2 can be set to an on state, and any one of the dummy cell transistors DTM1 and DTU and any one of the dummy cell transistors DTL1 and DTL0 can be set to an off state.

2.3 Effect of Second Embodiment

In the second embodiment, each of the memory pillars MP includes the dummy cell transistors DTL0 to DTL2 included in the first portion, the dummy cell transistors DTM0 and DTM1 included in the third portion, and the dummy cell transistor DTU included in the second portion. In the second embodiment, each of the threshold voltages of the dummy cell transistors DTL0 to DTL2, DTM0, DTM1, and DTU is preset to a predetermined state different between each of the string units SU before the reading operation. In this manner, the same effect as that of the first embodiment can be obtained.

3. Others

In the first embodiment and the second embodiment, the case where the dummy cell transistor DT is set to four states ("S0" state, "S1" state, "S2" state, and "S3" state) with different threshold voltages is described. However, the present embodiment is not limited to this. A dummy cell transistor DT is set to an optional number, such as two or eight states depending on the number of string units SU.

Specifically, in a case where a NAND flash memory 1 includes two string units SU0 and SU1 and each of the string units SU has a structure equivalent to that of the string unit SU in the first embodiment or the second embodiment, the dummy cell transistor DT is set to any of two states with different threshold voltages (for example, an "S0" state and an "S1" state in the ascending order of the threshold voltage). The threshold voltage of the dummy cell transistor DT of the string units SU0 and SU1 can be set to be equivalent to the threshold voltage of the dummy cell transistor DT of the string units SU0 and SU1 in the first embodiment or the second embodiment, for example.

Further, in a case where a NAND flash memory 1 includes eight string units SU0 to SU7 and each of the string units SU has a structure equivalent to that of the string unit SU in the first embodiment or the second embodiment, the dummy cell transistor DT is set to any of eight states with different threshold voltages (for example, an "S0" state to an "S7" state in the ascending order of the threshold voltage). A dummy cell transistor DTU of each of the string units SU0 to SU7 can be set to, for example, the "S0" state to the "S7" state. In this case, a dummy cell transistor DTM1 of each of the string units SU0 to SU7 is set to the "S7" state to the "S0" state. Further, the respective dummy cell transistor DTM0 of each of the string units SU0 to SU7 can be set to, for example, the "S0" state to the "S7" state. In this case, a dummy cell transistor DTL2 of each of the string units SU0 to SU7 is set to the "S7" state to the "S0" state. Further, a dummy cell transistor DTL1 of each of the string units SU0 to SU7 can be set to, for example, the "S0" state to the "S7" state. In this case, a dummy cell transistor DTL0 of each of the string units SU0 to SU7 is set to the "S7" state to the "S0" state.

Further, in the description of the first embodiment and the second embodiment, the case where the dummy cell transistor DT is used as the select transistor for controlling the electrical connection of the channel included in the memory pillar MP of the string unit SU is described. However, the present embodiment is not limited to this. For example, as the select transistor, the memory cell transistor MT may be used instead of the dummy cell transistor DT.

Further, in the NAND flash memory 1 according to the first embodiment and the second embodiment, the example where the electrical connection between two adjacent portions of the first to third portions of the memory pillar MP and the electrical connection between the first portion and the source line CELSRC are controlled by the dummy cell transistor DT that is common-connected in the block BLK is shown. However, the present embodiment is not limited to these. For example, the NAND flash memory 1 may control the electrical connection between the first portion and the second portion in the first embodiment for each of the string units SU by a select element provided one for each of the string units SU. Further, the NAND flash memory 1 may control the electrical connection between the first portion and the third portion in the second embodiment for each of the string units SU by a select element provided one for each of the string units SU. Further, the NAND flash memory 1 may control the electrical connection between the second portion and the third portion in the second embodiment for each of the string units SU by a select element provided one for each of the string units SU. Further, the NAND flash memory 1 may control the electrical connection between the first portion and the source line CELSRC in the first embodiment and the second embodiment for each of the string units SU by a select element provided one for each of the string units SU. That is, the NAND flash memory 1 only needs to be configured so that a channel of at least one of the memory cell transistors MT is in a floating state in the non-selected string unit SU during the reading operation.

Further, in the first embodiment and the second embodiment, the case where the memory pillar MP includes two layers (two tiers) of the first portion and the second portion, and the case where the memory pillar MP includes three layers (three tiers) of the first portion, the second portion, and the third portion are shown. However, the present embodiment is not limited to these. The NAND flash memory 1 may include the memory pillar MP of, for example, one layer (one tier) or four layers (four tiers) or more.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:
1. A semiconductor memory device comprising:
   a first memory string including a first select transistor, a first memory cell, a first select element, a second memory cell, and a second select element in series, the first memory cell being provided between the first select transistor and the first select element, and the second memory cell being provided between the first select element and the second select element;

a second memory string including a second select transistor, a third memory cell, a third select element, a fourth memory cell, and a fourth select element in series, the third memory cell being provided between the second select transistor and the third select element, and the fourth memory cell being provided between the third select element and the fourth select element;
a first wiring connecting a gate of the first memory cell and a gate of the third memory cell;
a second wiring connecting a gate of the second memory cell and a gate of the fourth memory cell; and
a control circuit configured to set the second select transistor to an on state, and to set the third select element and the fourth select element to an off state, when reading data of the first memory cell.

2. The semiconductor memory device of claim 1, wherein:
the first select element includes a third select transistor and a fourth select transistor in series,
the third select element includes a fifth select transistor and a sixth select transistor in series,
a threshold voltage of the third select transistor is larger than a threshold voltage of the fifth select transistor,
a threshold voltage of the fourth select transistor is smaller than a threshold voltage of the sixth select transistor, and
when reading the data of the first memory cell, the control circuit is configured to apply a first voltage to a gate of the third select transistor and a gate of the fifth select transistor, and to apply a second voltage larger than the first voltage to a gate of the fourth select transistor and a gate of the sixth select transistor.

3. The semiconductor memory device of claim 2, further comprising:
a third wiring commonly connecting the gate of the third select transistor and the gate of the fifth select transistor; and
a fourth wiring commonly connecting the gate of the fourth select transistor and the gate of the sixth select transistor.

4. The semiconductor memory device of claim 1, wherein the control circuit is configured to set the fourth select element to an on state, and to set the second select transistor and the third select element to an off state, when reading the data of the first memory cell.

5. The semiconductor memory device of claim 4, wherein:
the first select element includes a third select transistor and a fourth select transistor in series,
the third select element includes a fifth select transistor and a sixth select transistor in series,
a threshold voltage of the third select transistor is larger than a threshold voltage of the fifth select transistor,
a threshold voltage of the fourth select transistor is smaller than a threshold voltage of the sixth select transistor, and
when reading data of the second memory cell, the control circuit is configured to apply a first voltage to a gate of the third select transistor and a gate of the fifth select transistor, and to apply a second voltage different from the first voltage to a gate of the fourth select transistor and a gate of the sixth select transistor.

6. The semiconductor memory device of claim 5, further comprising:
a third wiring commonly connecting the gate of the third select transistor and the gate of the fifth select transistor; and
a fourth wiring commonly connecting the gate of the fourth select transistor and the gate of the sixth select transistor.

7. The semiconductor memory device of claim 5, wherein:
the second select element includes a seventh select transistor and an eighth select transistor in series,
the fourth select element includes a ninth select transistor and a tenth select transistor in series,
a threshold voltage of the seventh select transistor is larger than a threshold voltage of the ninth select transistor,
a threshold voltage of the eighth select transistor is smaller than a threshold voltage of the tenth select transistor, and
when reading the data of the second memory cell, the control circuit is configured to apply a third voltage different from the first voltage and the second voltage to a gate of the seventh select transistor, a gate of the eighth select transistor, a gate of the ninth select transistor, and a gate of the tenth select transistor.

8. The semiconductor memory device of claim 7, further comprising:
a fifth wiring commonly connecting the gate of the seventh select transistor and the gate of the ninth select transistor; and
a sixth wiring commonly connecting the gate of the eighth select transistor and the gate of the tenth select transistor.

9. The semiconductor memory device of claim 1, further comprising a seventh wiring,
wherein:
the first memory string further includes a fifth select element provided between the second memory cell and the second select element, and a fifth memory cell provided between the fifth select element and the second select element,
the second memory string further includes a sixth select element provided between the fourth memory cell and the fourth select element, and a sixth memory cell provided between the sixth select element and the fourth select element, and
the seventh wiring connects a gate of the fifth memory cell and a gate of the sixth memory cell.

10. The semiconductor memory device of claim 9, wherein:
the first select element includes a third select transistor and a fourth select transistor in series,
the third select element includes a fifth select transistor and a sixth select transistor in series,
a threshold voltage of the third select transistor is larger than a threshold voltage of the fifth select transistor,
a threshold voltage of the fourth select transistor is smaller than a threshold voltage of the sixth select transistor, and
when reading the data of the first memory cell, the control circuit is configured to apply a first voltage to a gate of the third select transistor and a gate of the fifth select transistor, and to apply a second voltage larger than the first voltage to a gate of the fourth select transistor and a gate of the sixth select transistor.

11. The semiconductor memory device of claim 10, further comprising:
a third wiring commonly connecting the gate of the third select transistor and the gate of the fifth select transistor; and a fourth wiring commonly connecting the gate of the fourth select transistor and the gate of the sixth select transistor.

12. The semiconductor memory device of claim 10, wherein:
the second select element includes a seventh select transistor and an eighth select transistor in series,
the fourth select element includes a ninth select transistor and a tenth select transistor in series,
a threshold voltage of the seventh select transistor is larger than a threshold voltage of the ninth select transistor,
a threshold voltage of the eighth select transistor is smaller than a threshold voltage of the tenth select transistor, and
when reading the data of the first memory cell, the control circuit is configured to apply the first voltage to a gate of the seventh select transistor and a gate of the ninth select transistor, and to apply the second voltage to a gate of the eighth select transistor and a gate of the tenth select transistor.

13. The semiconductor memory device of claim 12, further comprising:
a fifth wiring commonly connecting the gate of the seventh select transistor and the gate of the ninth select transistor; and
a sixth wiring commonly connecting the gate of the eighth select transistor and the gate of the tenth select transistor.

14. The semiconductor memory device of claim 12, wherein
the fifth select element includes an eleventh select transistor and a twelfth select transistor in series,
the sixth select element includes a thirteenth select transistor and a fourteenth select transistor in series,
a threshold voltage of the eleventh select transistor is larger than a threshold voltage of the thirteenth select transistor,
a threshold voltage of the twelfth select transistor is smaller than a threshold voltage of the fourteenth select transistor, and
when reading the data of the first memory cell, the control circuit is configured to apply a third voltage larger than the second voltage to a gate of the eleventh select transistor, a gate of the twelfth select transistor, a gate of the thirteenth select transistor, and a gate of the fourteenth select transistor.

15. The semiconductor memory device of claim 14, further comprising:
an eighth wiring commonly connecting the gate of the eleventh select transistor and the gate of the thirteenth select transistor; and
a ninth wiring commonly connecting the gate of the twelfth select transistor and the gate of the fourteenth select transistor.

16. The semiconductor memory device of claim 9, wherein the control circuit is configured to set the fourth select element to an on state, and to set the second select transistor and the third select element to an off state, when reading the data of the first memory cell.

17. The semiconductor memory device of claim 16, wherein:
the first select element includes a third select transistor and a fourth select transistor in series,
the third select element includes a fifth select transistor and a sixth select transistor in series,
a threshold voltage of the third select transistor is larger than a threshold voltage of the fifth select transistor,
a threshold voltage of the fourth select transistor is smaller than a threshold voltage of the sixth select transistor, and
when reading data of the fifth memory cell, the control circuit is configured to apply a first voltage to a gate of the third select transistor and a gate of the fifth select transistor, and to apply a second voltage larger than the first voltage to a gate of the fourth select transistor and a gate of the sixth select transistor.

18. The semiconductor memory device of claim 17, wherein:
the second select element includes a seventh select transistor and an eighth select transistor in series,
the fourth select element includes a ninth select transistor and a tenth select transistor in series,
a threshold voltage of the seventh select transistor is larger than a threshold voltage of the ninth select transistor,
a threshold voltage of the eighth select transistor is smaller than a threshold voltage of the tenth select transistor, and
when reading the data of the fifth memory cell, the control circuit is configured to apply a third voltage larger than the second voltage to a gate of the seventh select transistor, a gate of the eighth select transistor, a gate of the ninth select transistor, and a gate of the tenth select transistor.

19. The semiconductor memory device of claim 18, wherein:
the fifth select element includes an eleventh select transistor and a twelfth select transistor in series,
the sixth select element includes a thirteenth select transistor and a fourteenth select transistor in series,
a threshold voltage of the eleventh select transistor is larger than a threshold voltage of the thirteenth select transistor,
a threshold voltage of the twelfth select transistor is smaller than a threshold voltage of the fourteenth select transistor, and
when reading the data of the fifth memory cell, the control circuit is configured to apply the third voltage to a gate of the eleventh select transistor, a gate of twelfth select transistor, a gate of the thirteenth select transistor, and a gate of the fourteenth select transistor.

20. The semiconductor memory device of claim 19, further comprising:
a third wiring commonly connecting a gate of the third select transistor and the gate of the fifth select transistor;
a fourth wiring commonly connecting the gate of the fourth select transistor and the gate of the sixth select transistor;
a fifth wiring commonly connecting the gate of the seventh select transistor and the gate of the ninth select transistor;
a sixth wiring commonly connecting the gate of the eighth select transistor and the gate of the tenth select transistor;
an eighth wiring commonly connecting the gate of the eleventh select transistor and the gate of the thirteenth select transistor; and
a ninth wiring commonly connecting the gate of the twelfth select transistor and the gate of the fourteenth select transistor.

* * * * *